US010179860B2

(12) United States Patent
Xu et al.

(10) Patent No.: US 10,179,860 B2
(45) Date of Patent: Jan. 15, 2019

(54) HIGH REFRACTIVE INDEX SILICONE NANOCOMPOSITES

(71) Applicant: PIXELLIGENT TECHNOLOGIES LLC, Baltimore, MD (US)

(72) Inventors: Wei Xu, Baltimore, MD (US); Xia Bai, Baltimore, MD (US); Maneesh Bahadur, Baltimore, MD (US); Linfeng Gou, Baltimore, MD (US); Lei Zheng, Baltimore, MD (US); James Criniti, Baltimore, MD (US); Gregory Cooper, Baltimore, MD (US); Serpil Gonen Williams, Baltimore, MD (US)

(73) Assignee: PIXELLIGENT TECHNOLOGIES LLC, Baltimore, MD (US)

( * ) Notice: Subject to any disclaimer, the term of this patent is extended or adjusted under 35 U.S.C. 154(b) by 0 days.

(21) Appl. No.: 15/022,826

(22) PCT Filed: Sep. 23, 2014

(86) PCT No.: PCT/US2014/057035
§ 371 (c)(1),
(2) Date: Mar. 17, 2016

(87) PCT Pub. No.: WO2015/069384
PCT Pub. Date: May 14, 2015

(65) Prior Publication Data
US 2016/0233391 A1 Aug. 11, 2016

Related U.S. Application Data

(60) Provisional application No. 61/881,158, filed on Sep. 23, 2013, provisional application No. 61/895,363, filed on Oct. 24, 2013, provisional application No. 62/037,872, filed on Aug. 15, 2014.

(51) Int. Cl.
*C09C 3/12* (2006.01)
*C09C 3/10* (2006.01)
*H01L 33/56* (2010.01)
*H01L 23/29* (2006.01)
*H01L 27/32* (2006.01)
*C09D 183/06* (2006.01)
*H01L 33/50* (2010.01)
*C01G 25/02* (2006.01)
*H01L 51/52* (2006.01)

(52) U.S. Cl.
CPC ............... *C09C 3/12* (2013.01); *C09C 3/10* (2013.01); *C09D 183/06* (2013.01); *H01L 23/296* (2013.01); *H01L 27/322* (2013.01); *H01L 33/502* (2013.01); *H01L 33/56* (2013.01); *C01G 25/02* (2013.01); *H01L 51/5253* (2013.01); *H01L 2251/5369* (2013.01)

(58) Field of Classification Search
CPC ......... C08L 83/04; H01L 23/296; H01L 33/56

USPC .............. 524/588; 257/788, 789, 491
See application file for complete search history.

(56) References Cited

U.S. PATENT DOCUMENTS

| 7,282,270 | B2 | 10/2007 | Morita et al. |
|---|---|---|---|
| 8,518,473 | B2 | 8/2013 | Tao |
| 8,592,511 | B2 | 11/2013 | Gonen Williams et al. |
| 8,883,903 | B2 | 11/2014 | Gonen Williams et al. |
| 8,920,675 | B2 | 12/2014 | Xu et al. |
| 9,187,643 | B2 | 11/2015 | Benicewicz |
| 2006/0073347 | A1 | 4/2006 | Morita et al. |
| 2012/0088845 | A1 | 4/2012 | Gonen et al. |
| 2012/0217456 | A1* | 8/2012 | Nagakawa ............... C01G 9/02 252/582 |
| 2013/0211016 | A1* | 8/2013 | Otsuka ................. B82Y 30/00 525/475 |
| 2013/0221279 | A1 | 8/2013 | Xu et al. |
| 2014/0295649 | A1 | 10/2014 | Gonen Williams et al. |
| 2014/0302664 | A1 | 10/2014 | Gonen Williams et al. |

FOREIGN PATENT DOCUMENTS

| JP | 2013-139547 | 7/2013 |
|---|---|---|
| WO | WO 2011/094425 A2 | 8/2011 |
| WO | WO2013/078309 | 5/2013 |
| WO | WO 2013/078309 A1 | 5/2013 |
| WO | WO 2014/046309 * | 3/2014 |
| WO | WO 2014/064655 * | 5/2014 |
| WO | WO 2014/165516 A1 | 10/2014 |
| WO | WO2015/164779 A1 | 10/2015 |

OTHER PUBLICATIONS

"Refractive Index Engineering of Transparent ZrO2-Polydimethylsiloxane Nanocomposites" authored by Lee et al. and published in the Journal of Materials Chemistry (2008) 18, 1751-55.*
"Dispersion and Functionalization of Nonaqueous Synthesized Zirconia Nanocrystals via Attachment of Silane Coupling Agents" authored by Luo and published in Langmuir (2008) 24, 11497.*
International Search Report for PCT/US2014/057035, dated Jul. 16, 2015, 3 pages.
Written Opinion of the ISA for PCT/US2014/057035, dated Jul. 16, 2015, 8 pages.
Kusova et al., "Brightly luminescent organically capped silicon nanocrystals fabricated at room temperature and atmospheric pressure" ACS Nano, Aug. 6, 2010, vol. 4, No. 8, pp. 4495-4504.

(Continued)

*Primary Examiner* — Marc S Zimmer
(74) *Attorney, Agent, or Firm* — Nixon & Vanderhye P.C.

(57) ABSTRACT

The present disclosure provides nanocrystal(s) containing silicone capping agent(s). Dispersions containing the nanocrystal(s) and at least one of silicone monomer(s), silicone pre-polymer(s), and silicone polymer(s), and optionally additionally containing a solvent are also described. Cured dispersions, compositions of nanocrystal(s) and LEDs and related structures containing the composition(s) are provided in the present disclosure.

21 Claims, 8 Drawing Sheets

(56) References Cited

OTHER PUBLICATIONS

Garnweitner et al., Large-scale synthesis of organophilic zirconia nanoparticles and their application in organic-inorganic Nanocomposites for Efficient Volume Holography, Small, Sep. 4, 2007, vol. 3, No. 9, pp. 1626-1632.

Supplementary European Search dated Feb. 7, 2017 received in EP14860153 (Title: "High Refractive Index Silicone Nanocomposites" Xu et al; Apr. 18, 2016).

Li et al, "Bimodal Surface Ligand Engineering: The Key to Tunable Nanocomposites" Langmuir, 2013, 29 (4), pp. 1211-1220 DOI: 10.1021/1a3036192 Publication Date (Web): Oct. 23, 2012.

Li et al. "Ligand Engineering of Polymer Nanocomposites: From the Simple to the Complex" ACS Appl. Mater. Interfaces, 2014, 6 (9), pp. 6005-6021 DOI: 10.1021/am405332a Publication Date (Web): Jan. 29, 2014.

Tao et al. "Transparent Dispensible High-Refractive Index ZrO2/Epoxy Nanocomposites for LED Encapsulation" Published online J. Appl. Polym. Sci. 2013, DOI: 10.1002/APP.39652.

Tao et al. "Transparent luminescent silicone nanocomposites filled with bimodal PDMS—brush-grafted CdSe quantum dots" J. Mater. Chem. C, 2013, 1, 86-94 (2013).

\* cited by examiner

HIGH REFRACTIVE INDEX SILICONE NANOCOMPOSITES

This application is the U.S. national phase of International Application No. PCT/US2014/057035, filed Sep. 23, 2014, and claims benefit of U.S. Provisional Application No. 61/881,158, filed Sep. 23, 2013, U.S. Provisional Application No. 61/895,363, filed Oct. 24, 2013, and U.S. Provisional Application No. 62/037,872, filed Aug. 15, 2014, the entire contents of each of which is hereby incorporated herein by reference.

The silicone material family has a unique combination of properties: they are optically transparent from infra-red (IR) to visible to ultra-violet (UV) spectrum; they are thermally stable; and their low viscosity makes them suitable for a variety of processing techniques. This unique combination of properties is desirable for many electronic and optical applications such as high brightness light emitting diodes (HB-LED), organic light emitting diodes (OLED), solar cells, lasers etc.

Silicones typically have refractive index less than 1.6, and in many cases less than 1.55. For many of the above mentioned applications, high refractive index is desired to couple light in and out of the device more efficiently. For example, in an HB-LED the mismatch of the refractive index of the active materials, which is ~2.6, and that of the silicone encapsulant, results in some emitted light being trapped inside the chip and reduces overall efficiency of the device. Improving the refractive index of the silicone materials while preserving other properties is critical to many applications.

Inorganic materials, such as metal oxide, typically have higher refractive index than most polymers. However these materials are generally rigid and difficult to process. By combining nanocrystals of these materials with a silicone matrix it is possible to create nanocomposites that possess high refractive index, high clarity, and maintain the thermal stability, processability, and mechanic properties of the silicone materials.

Nanocrystals and Capped Nanocrystals

The present disclosure provides nanocrystals comprising metal oxides selected from zirconium oxide, titanium oxide, hafnium oxide, zinc oxide, yttrium oxide, and niobium oxide and mixtures and alloys thereof. Said nanocrystals having high bulk refractive indexes, typically larger than 1.9 in the visible spectrum, as well as exceptional transparency. Said nanocrystals have diameters much smaller than the wavelength of the actinic light, or smaller than one tenth of the actinic wavelength, to minimize light scattering.

The potential incompatibility between the inorganic nanoparticles and silicone polymers may lead to agglomeration, which can cause loss in the optical transparency and severely limits its use in optical applications. The presently disclosed nanocrystals may be capped with at least one capping agent. The at least one capping agent of presently disclosed capped nanocrystals may also be referred to as capping ligand or capping group. These capping agent or capping agents can be attached to the surface of the nanocrystals to provide desired properties when dispersed into solvents, monomers, polymers, or mixtures thereof.

GENERAL DESCRIPTION OF CAPPING AGENTS

Figure 1:
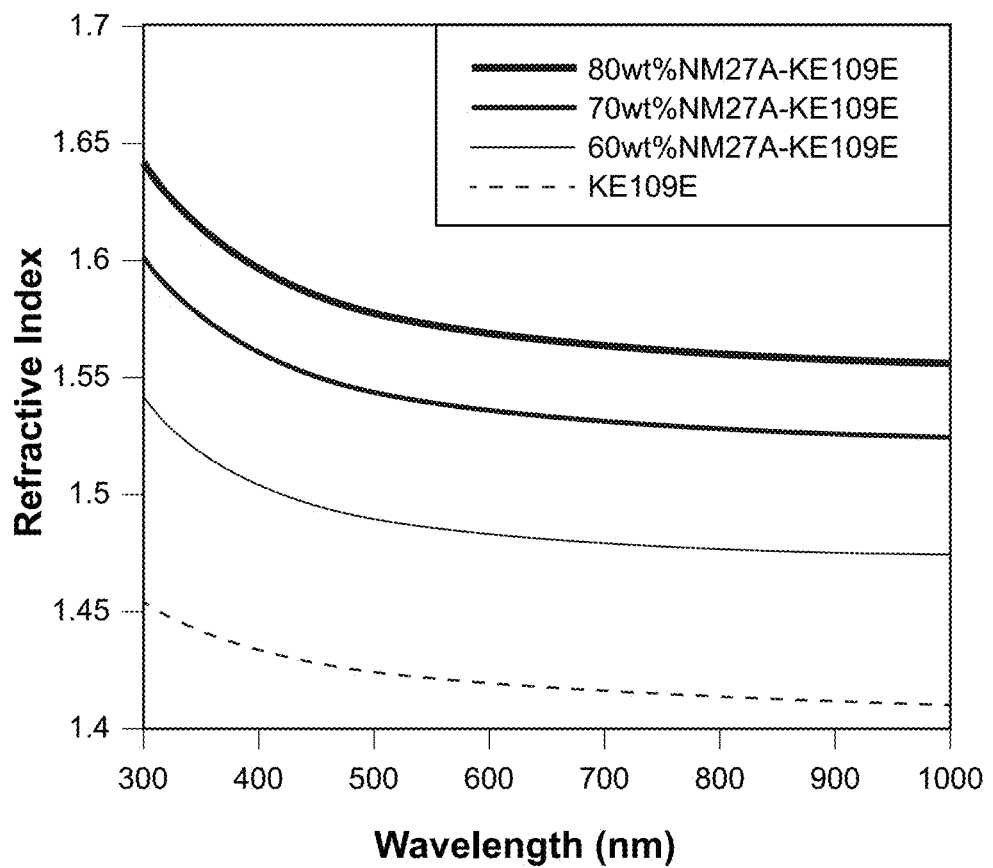
FIG. 1 shows a Refractive Index versus wavelength for KE-109E di-methyl silicone at 60, 70 and 80 weight percent loading of zirconia nanocrystal.
Figure 2:
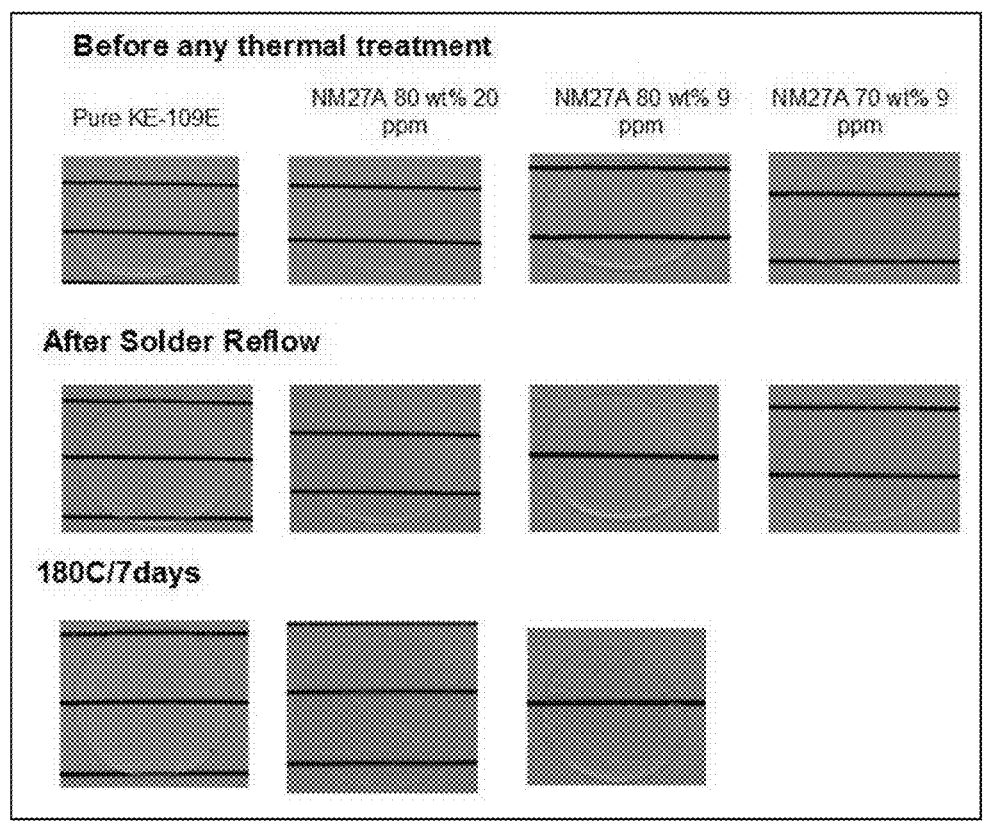
FIG. 2 shows optical images for KE-109E di-methyl silicone nanocomposites at 70 and 80 weight percent loading of zirconia nanocrystal before and after solder reflow and after thermal aging at 180 C for 7 days.
Figure 3:
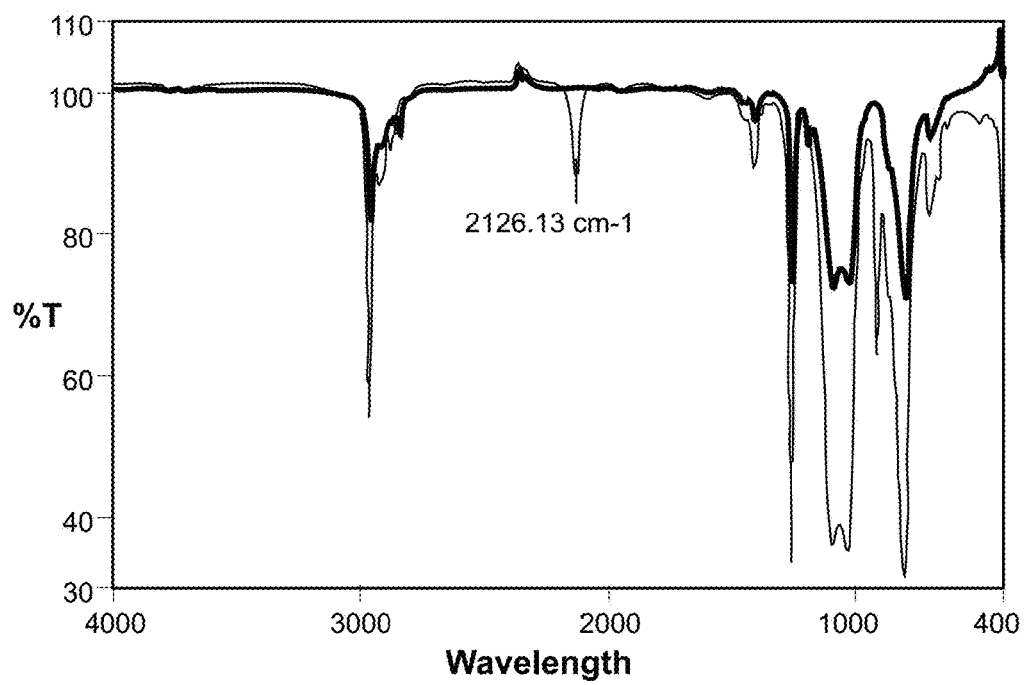
FIG. 3 shows an infrared spectrum confirming the absence of SiH peak at 2126 cm-1 wavenumber for synthesis of capping agent in example 1.
Figure 4:
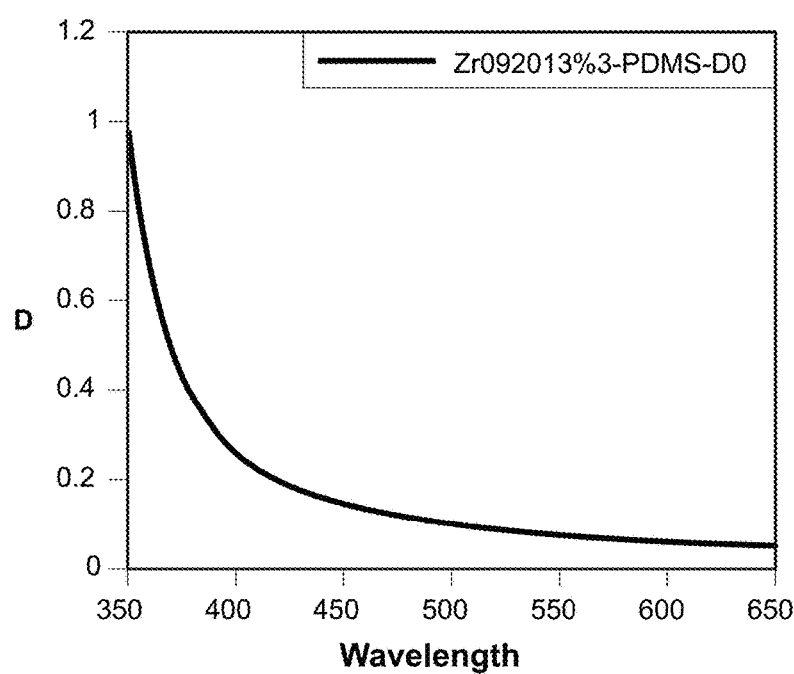
FIG. 4 shows an absorbance measurement for 50 weight percent zirconia nanocrystal dispersion in xylene.
Figure 5:
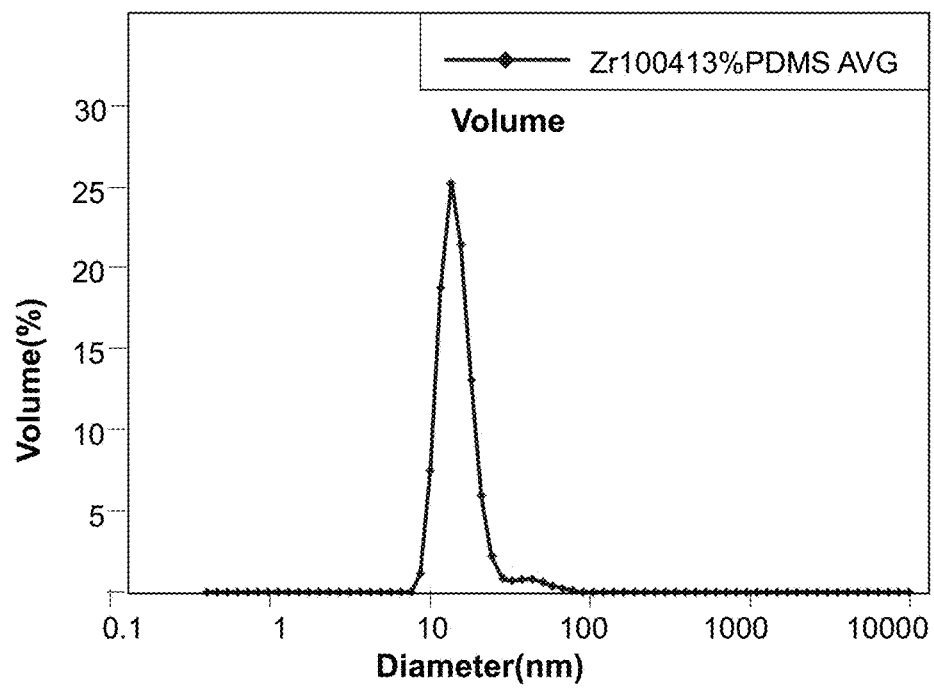
FIG. 5 shows a Dynamic Light Scattering measurement for 50 weight percent zirconia nanocrystal dispersion in xylene. The mean diameter was 15.92 nm, peak 1 diameter is 16.99 nm and dv (99.99) is 96.1 nm.
Figure 6:
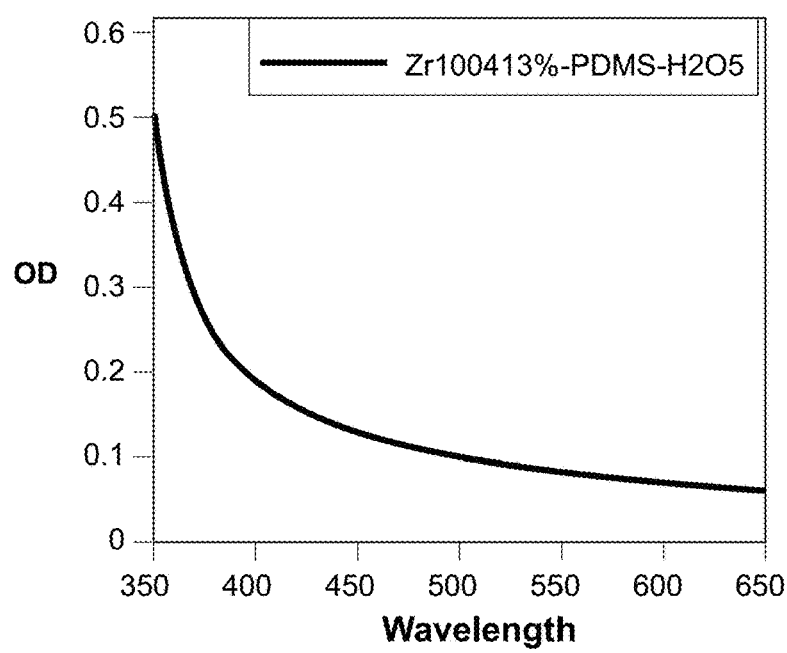
FIG. 6 shows an absorbance measurement for 50 weight percent zirconia nanocrystal dispersion in xylene.
Figure 7:
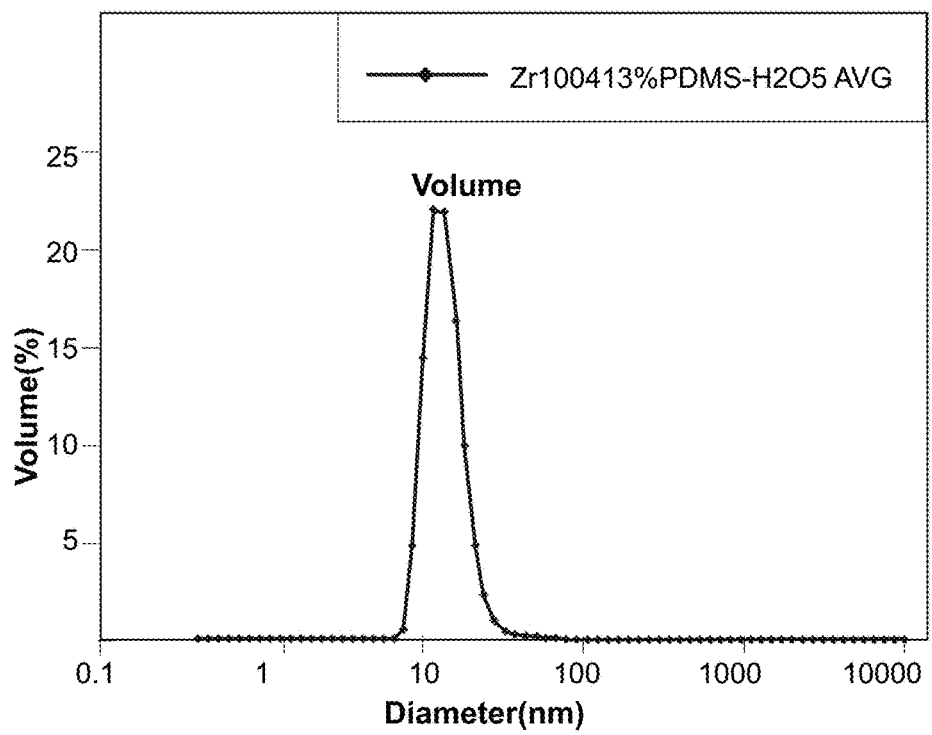
FIG. 7 shows a Dynamic Light Scattering measurement for 50 weight percent zirconia nanocrystal dispersion in xylene. The mean diameter was 14.64 nm, peak 1 diameter is 17.7 nm and Dv (99.99) value is 112.0 nm.
Figure 8:
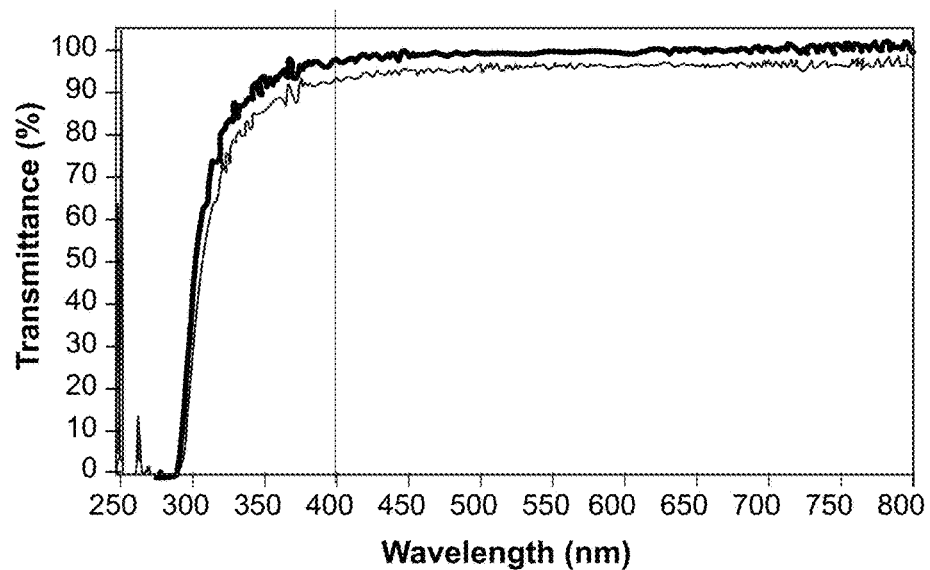
FIG. 8 shows a percent transmittance curve for silicone nanocomposite in example 3b before (98.0 at 400 nm) and after (92.2 at 400 nm) heat treatment at 250 C for 1 minute.

The present disclosure describes a capping agent comprising a head group and a tail group. Said head group, as represented by group Z shown below is capable of binding to the surface of the nanocrystals through a covalent linkage.

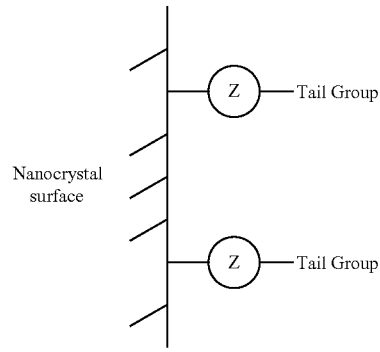

Schematic of a Capping Agent Comprising a Head Group and a Tail Group

The presently disclosed covalent linkage may comprise oxygen, sulfur, phosphorous, or silicon elements.

The head group with the silicon covalent linkage may comprise either a trialkoxysilane group or a trichlorosilane group, although bi- and mono-substituted alkoxy and chloro silanes are also possible. The head anchors to the surface of the oxide through a covalent bond with the hydroxide groups (—OH) or —OR group wherein R is an alkyl or aryl group, present at the surface, eliminating an alcohol, alkyl chloride, water or HCl as a by-product.

The head group with the oxygen covalent linkage may comprise a carboxylic acid (—COOH) group. The head anchors to the surface of the oxide through a covalent bond with the —OH or —OR groups (R=alkyl or aryl) present at the surface, eliminating an alcohol, or water as a by-product.

The head group with the phosphorous covalent linkage comprises organophosphorus functional group (e.g., organophosphate group or an organophosphono group) for covalently binding to the nanocrystals. The organophosphorus functional group may be covalently bonded to a single tail group which can be generally represented by R—PO(OH)$_2$ for a phosphono group or R—O—PO(OH)$_2$ for a phosphate group where R represents a 2 to 12 carbon chain length.

The tail group of the presently disclosed capping agent may comprise functional or a nonfunctional group, said groups may further comprise a silicone chain or a hydrocarbon chain, as shown below.

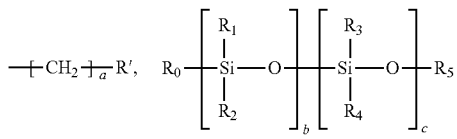

Examples of Tail Group Structures

The silicone chain of the presently disclosed functional or non-functional tail groups may comprise groups $R_1$, $R_2$, $R_3$, $R_4$, each may be selected from H, alkyl groups, aryl groups, polyaryl groups, vinyl groups, allyl groups, epoxy groups, acrylate groups or the combination thereof, the b and c independently may have range from 0 to 60 in the polymer chain while b and c cannot both be zero, and the connecting group, $R_0$, connecting the said tail group to the head group, examples of said connecting group may comprise $(CH_2)_a$ repeating units, ether groups, or carbonyl groups. $R_5$ may be an end group such as $Si(CH_3)_3$, $Si(CH_3)_2H$, $Si(CH_3)_2(CHCH_2)$, or $Si(CH_3)_2(C_4H_9)$.

The hydro-carbon chain of the presently disclosed functionalized or non-functionalized tail groups may comprise of $(CH_2)_a$ unit with 'a' having a value 2 to 18, the R' in the above may comprise —H or an alkyl group such as methyl, ethyl, butyl, or t-butyl.

The presently disclosed capping agent with non-functional tail groups may comprise n-propyltrimethoxysilane, n-propyltriethoxysilane, n-octyltrimethoxysilane, n-octyltriethoxysilane, n-dodecyltrimethoxysilane, n-dodecyltriethoxysilane, nhexadecyltrimethoxysilane, octadecyltrimethoxysulane, phenytrimethoxysilane, nphenylethylphenyltrimethoxysilane, 2-[methoxy(polyethyleneoxy)propyl]-trimethoxysilane, methoxytri(ethyleneoxy)propyltrimethoxysilane, octanoic acid, acetic acid, propionic acid, 2-[2-(2-methoxyethoxy)ethoxy] acetic acid, oleic acid, lauric acid, benzoic acid or isomers and mixtures thereof.

The functional groups of presently disclosed tail groups include an unsaturated hydro-carbon chain, such as an alkenyl or alkynyl groups. The non-functional group of presently disclosed tail group consists a saturated hydrocarbon chain, such as alkyl groups, with 2 to 18 carbon chain length, or 6 to 18 carbon chain length.

The presently disclosed capping agent with functional tail groups may comprise vinyltrimethoxysilane (VTMS), allyltrimethoxysilane (ATMS), 1-hexenyltrimethoxysilane, 1-octenyltrimethoxysilane (OTMS).

The current disclosure provides two strategies to improve the compatibility of the capped nanocrystals with a silicone matrix, first, is to synthesize a capping agent comprising a silicone chain with a head group capable of covalently bonding to the surface of the nanocrystals. The second strategy is to graft silicone polymer chain on to nanocrystals capped with functional hydro-carbon chains, i.e. siliconize the capped nanocrystals.

By tuning the composition, structure, and length of the capping agents the presently disclosed capped nanocrystals can be incorporated into silicone polymers and cured to form optically clear silicone nanocomposites.

Strategy One—Nanocrystal capped with silicone containing capping agent, dispersion of the said nanocrystals in silicones, and curing the silicones to form nanocomposites.

Description of Silicone Capping Agents

The present disclosure describes a silicone capping agent comprising a head group and a tail group, said head group is capable of covalently binding to the surface of the nanocrystals through a covalent linkage, the presently disclosed covalent linkage to the nanocrystals may comprise elements such as oxygen, phosphorous, or silicon.

A head group with the silicon covalent linkage may comprise a trialkoxysilane group or a trichlorosilane group, a bi- or mono-substituted alkoxy and chloro silane. The head anchors to the surface of the oxide through a covalent bond with the hydroxide groups (—OH) or —OR group present at the surface, wherein R is an alkyl or aryl group, eliminating an alcohol, alkyl chloride, water or HCl as a by-product.

A head group with an oxygen covalent linkage may comprise a carboxylic acids (—COOH) group. The head anchors to the surface of the oxide through a covalent bond with the hydroxide groups (—OH) or —OR (R=alkyl or aryl) group present at the surface, eliminating an alcohol, or water as a by-product.

The head group with a phosphorous covalent linkage may comprise organophosphorus functional group (e.g. organophosphate group or a organophosphono group) for covalently binding to the nanocrystals. The organophosphorus functional group may be covalently bonded to a single tail group which can be generally represented by R—PO(OH)$_2$ for a phosphono group or R—O—PO(OH)$_2$ for a phosphate group where R represents a 2 to 12 carbon chain length.

The tail group of the presently disclosed silicone capping agent may comprise functional or a nonfunctional groups, said groups may further comprise a silicone chain, as shown below.

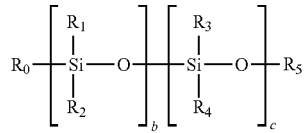

Exemplary Tail Group Structures in Silicone Capping Agent $R_1$, $R_2$, $R_3$, and $R_4$, may independently comprise $C_nH_{2n+1}$, where n may equal to 0 to 5, aromatic (phenyl containing) groups with $C_6$-30 carbon atoms, vinyl groups, allyl groups, acrylate groups, epoxy groups and may be same or different. $R_5$ may be an end group such as $Si(CH_3)_3$, $Si(CH_3)_2H$, $Si(CH_3)_2(CHCH_2)$, or $Si(CH_3)_2(C_4H_9)$. Selected examples of $R_1$, $R_2$, $R_3$ and $R_4$ may comprise the following groups:

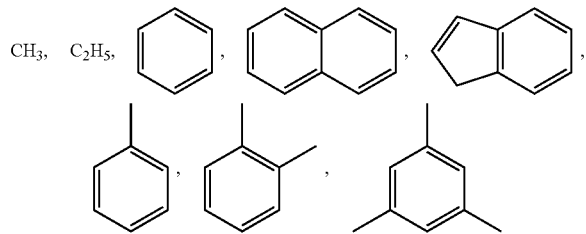

Selected Examples of $R_1$, $R_2$, $R_3$, and $R_4$

Selected examples of said tail group may comprise a group identified by the formulas listed below.

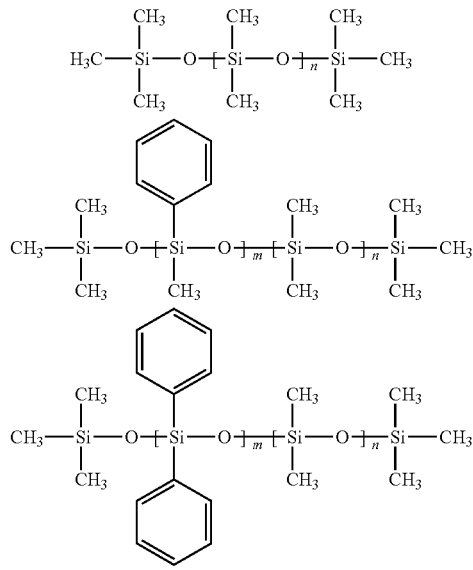

Selected Examples of Commercially Available Tail Groups

The presently disclosed silicone capped nanocrystals may additionally comprise hydro-carbon chain capping agents. Said hydro-carbon chains of said capping agents may comprise non-functional tail groups or functional tail groups comprising unsaturated groups such as alkenyl or alkynyl groups. The said non-functional tail groups contain hydrocarbon chains, such as alkyl groups, with 2 to 18 carbon chain length, or 6 to 18 carbon chain length. Said functional tail groups may comprise vinyltrimethoxysilane (VTMS), allyltrimethoxysilane (ATMS), 1-hexenyltrimethoxysilane, 1-octenyltrimethoxysilane (OTMS).

The presently disclosed silicone capped nanocrystals may additionally comprise hydro-carbon chain capping agents. Said hydro-carbon chains of said capping agents may comprise non-functional tail groups said non-functional tail groups may comprise n-propyltrimethoxysilane, n-propyltriethoxysilane, n-octyltrimethoxysilane, n-octyltriethoxysilane, phenytrimethoxysilane, phenylethylphenyltrimethoxysilane, 2-[methoxy(polyethyleneoxy)propyl]-trimethoxysilane, methoxytri(ethyleneoxy) propyltrimethoxysilane, octanoic acid, acetic acid, propionic acid, 2-[2-(2-methoxyethoxy)ethoxy] acetic acid, oleic acid, benzoic acid or isomers and mixtures thereof.

Synthesis of an exemplary silicone capping agent is shown in

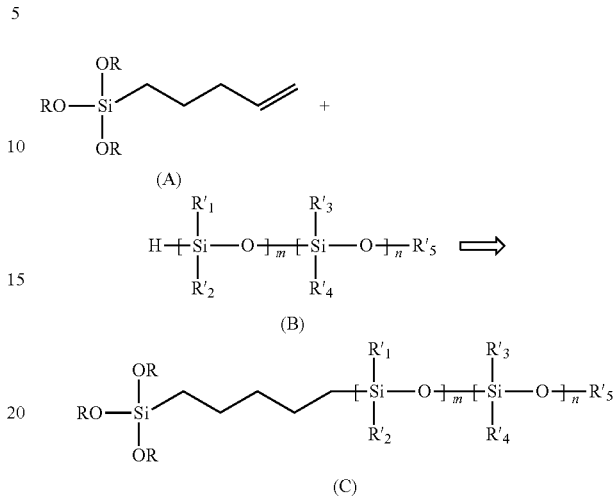

Synthesis Route of an Exemplary Silicone Capping Agent

The head group in the capping agent shown in (C) is derived from an alkoxysilane (A) with the general form $R'_nSi(OR)_{(4-n)}$, where n has a value 1 and 2; the R group is an alkyl group, such as a methyl or an ethyl group; and R' may comprise an alkenyl group such as vinyl, allyl, 1-hexenyl OR 1-octenyl.

The tail group of the capping agent is comprise a monofunctional Si—H containing silicone polymer (B) wherein groups $R'_1$, $R'_2$, $R'_3$, and $R'_4$, independently comprise an alkyl, aryl, and poly aryl groups. m and n independently can have a range between 0 to 60 while m and n cannot have a value of zero at the same time. $R_5$ may be an end group such as $Si(CH_3)_3$, $Si(CH_3)_2H$, $Si(CH_3)_2(CHCH_2)$, or $Si(CH_3)_2(C_4H_9)$.

Description of the Synthesis

The reaction between the monofunctional Si—H containing silicone polymer and the alkenyl functional alkoxysilane of the general $R'_nSi(OR)_{(4-n)}$ is catalyzed using a hydrosilylation catalyst. Hydrosilylation catalysts maybe one or more of platinum metal, platinum compounds, and platinum complexes. Selected examples of platinum compounds and platinum complexes may be exemplified by chloroplatinic acid, chloroplatinic acid hexahydrate, Karstedt's catalyst, $Pt(ViMe_2\text{-}SiOSiViMe_2)_2)$, dichloro-bis(triphenylphosphine) platinum (II), cis-dichloro-bis(acetonitrile)platinum(II), dicarbonyldichloroplatinum(II), platinum chloride, platinum oxide and others. The platinum metal can be deposited on a support such as charcoal, alumina, zirconia, carbon, silica gel, and others. Any platinum containing material which effects the reaction between the silicon hydride and the unsaturated portion of the unsaturated compound may be used.

Suitable amounts of the platinum containing compounds and the platinum complexes vary within wide limits. Concentrations on the order of 1 mole of catalyst (providing one mole of platinum) per billion moles of unsaturated groups in the unsaturated compound may be useful. Concentrations can be as high as 1 to 10 moles of catalyst per thousand moles of unsaturated groups in the unsaturated compound may also be employed. Preferable concentrations are from 1 mole of platinum per 1,000 moles of unsaturated groups to 1 mole of platinum per 1,000,000 mole of unsaturated groups in the unsaturated compound. Suitable amounts of supported platinum include, for example, from at least about 0.1 weight percent, or 0.1 to about 10 weight percent, or from about 0.5 to 5 weight percent based upon elemental platinum.

The catalyst may be dissolved in a solvent for ease of handling and to facilitate measuring the minute amounts needed. The solvent may be inert. Suitable solvents include the various hydrocarbon solvents such as benzene, toluene, xylene, and mineral spirits and polar solvents such as alcohols, various glycols and esters.

The relative amounts of silicon hydride and unsaturated compound employed in the process herein have no technical limitations. One unsaturated linkage, for example, ethylene, is the stoichiometric requirement per silicon bonded hydrogen atom. However there is no absolute necessity for equivalent amounts of the reactants to be employed and any desired excess of either reactant can be present. In fact an excess of one reactant, typically the unsaturated compound, may often be desirable to force the reaction to completion or to make the greatest use of the reactant which is the most expensive or most rare.

Nanocrystals Comprising Silicone Capping Agent

At least one capping agent of the presently disclosed capped nanocrystals comprise presently disclosed silicone capping agents. The nanocrystals comprising said silicone capping agents may optionally also comprise functional capping agents including, vinyltrimethoxysilane (VTMS), allyltrimethoxysilane (ATMS), 1-hexenyltrimethoxysilane, 1-octenyltrimethoxysilane (OTMS) or non-silicone capping agents n-propyltrimethoxysilane, n-propyltriethoxysilane, n-octyltrimethoxysilane, n-octyltriethoxysilane, n-dodecyltrimethoxysilane, n-dodecyltriethoxysilane phenytrimethoxysilane, phenylethylphenyltrimethoxysilane, 2-[methoxy(polyethyleneoxy)propyl]-trimethoxysilane, methoxytri(ethyleneoxy)propyltrimethoxysilane, octanoic acid, acetic acid, propionic acid, 2-[2-(2-methoxyethoxy)ethoxy] acetic acid, oleic acid, lauric acid, benzoic acid.

Process of Capping Nanocrystals

The present disclosure provides a process of making presently disclosed silicone capped nanocrystals comprising suspending the as synthesized nanocrystals described in US patent application No. 2012/0088845, as incorporated by reference herein, in nonpolar solvent such as toluene; adding presently disclosed silicone capping agent to the suspension at 20 to 60% by weight of said nanocrystals; heating the solution to between 60 to 150° C. for 30 to 60 minutes; and washing the nanocrystals and drying.

The present disclosure provides another process of making presently disclosed silicone capped nanocrystals comprising suspending the as synthesized nanocrystals described US patent application No. 2012/0088845, as incorporated by reference herein, in nonpolar solvent such as toluene; adding presently disclosed silicone capping agent to the suspension at 20 to 60% by weight of said nanocrystals; heating the solution to between 60 to 150° C. for 30 to 60 minutes; adding water to the reaction mixture, the amount of said water is 0.01 to 15 percent by weight of said nanocrystals and continuing to heat for additional 5 to 30 minutes; and washing the nanocrystals and drying.

Exemplary Strategy 2 for forming silicone nanocomposites comprising silicone grafted nanocrystals.

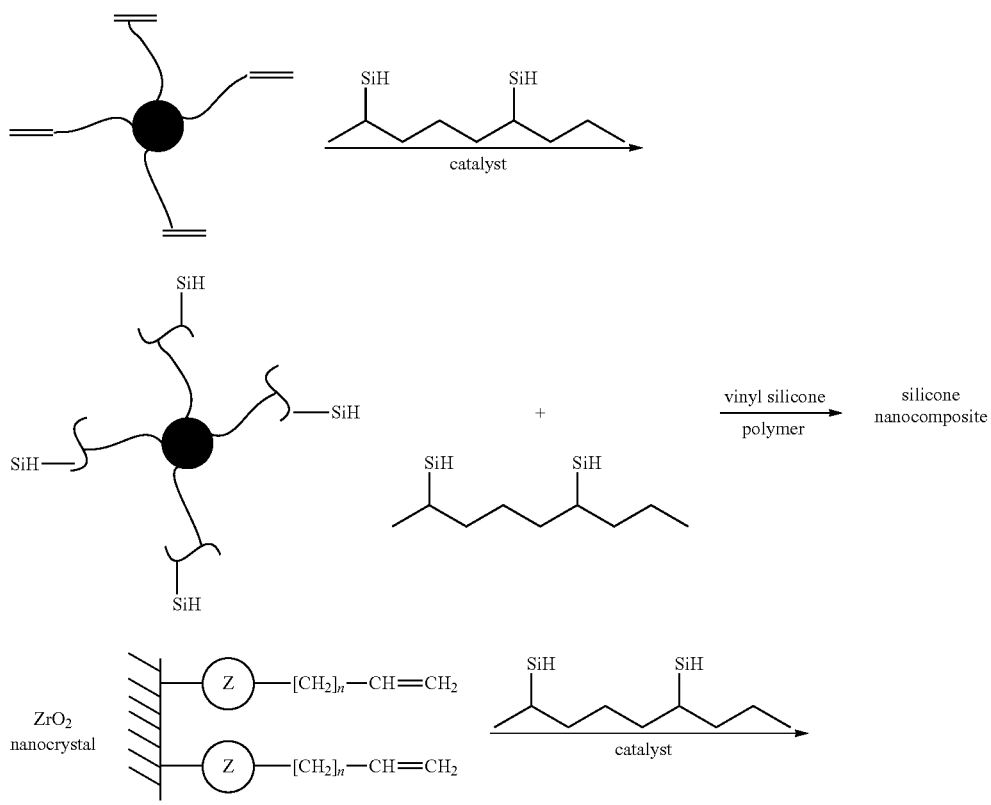

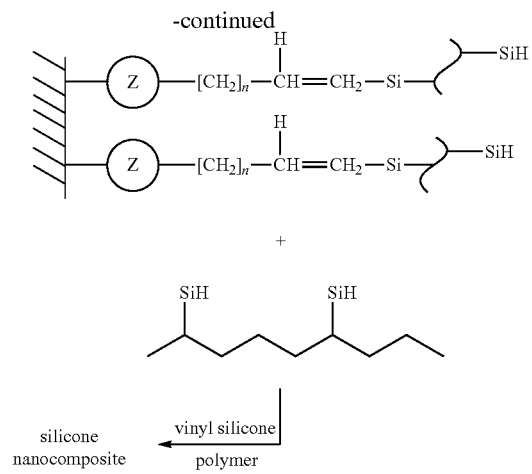

Strategy 2

As an alternative embodiment to the presently described technology, the silicone capped nanocrystals containing a functional group are further reacted to graft silicone polymer chains of varying lengths and properties onto the nanocrystals.

The present disclosure providing silicone grafted nanocrystals comprise at least one presently disclosed hydrocarbon capping agent with functional tail groups being grafted with silicone polymer chains, and optionally may additionally comprise a hydro-carbon capping agent with a non-functional tail group or a silicone capping agent (7C) wherein groups $R'_1$, $R'_2$, $R'_3$, and $R'_4$, independently comprise an alkyl, aryl, and poly aryl groups. m and n independently can have a range between 0 to 60 while m and n can not have a value of zero at the same time. $R_5$ may be an end group such as $Si(CH_3)_3$, $Si(CH_3)_2H$, $Si(CH_3)_2(CHCH_2)$ or $Si(CH_3)_2(C_4H_9)$.

The said functional tail groups include unsaturated hydrocarbon chains, such as alkenyl or alkynyl groups. The said non-functional tail groups contain hydro-carbon chains, such as alkyl groups, with 2 to 18 carbon chain length, or 6 to 18 carbon chain length, said functional tail groups may comprise vinyltrimethoxysilane, allyltrimethoxysilane, 1-hexenyltrimethoxysilane, 1-octenyltrimethoxysilane.

The presently disclosed capping agent with non-functional tail groups may comprise n-propyltrimethoxysilane, n-propyltriethoxysilane, n-octyltrimethoxysilane, n-octyltriethoxysilane, phenytrimethoxysilane, phenylethylphenyltrimethoxysilane, 2-[methoxy(polyethyleneoxy)propyl]-trimethoxysilane, methoxytri(ethyleneoxy) propyltrimethoxysilane, octanoic acid, lauric acid, acetic acid, propionic acid, 2-[2-(2-methoxyethoxy)ethoxy] acetic acid, oleic acid, benzoic acid or isomers and mixtures thereof.

The presently disclose silicon polymer chain may comprise silicon hydride polymer chain, said silicone hydride polymer chain comprises one or more silicon-bonded hydrogen atoms, said silicon-bonded hydrogen atoms may have linear or branched structure.

Said silicone polymer may comprise a polydimethylsiloxane, or a copolymer with dimethyl and (methyl,phenyl) groups, or a co-polymer with dimethyl and diphenyl groups.

The (phenyl,methyl) silicon hydride may contain between 0 to 50% by weight, or 5 to 50% by weight, of phenyl groups. The remaining groups on the polymer may comprise methyl groups. The refractive index of said silicon hydride polymer (in the absence of the nanocrystals) may be between 1.42 to 1.55, or between 1.5 and 1.55. The weight average molecular weight of said silicon hydride may be in the range of 100 to 10,000 Daltons (D), or in the range of 100 to 4,000 D, or in the range of 300 to 2,000 D.

Said silicon hydride polymer may comprise a single material or a combination of two or more silicon hydride polymers that differ in at least one of the following properties: structure, viscosity, average molecular weight, siloxane units, and sequence.

Catalyst for Grafting Silicone Polymer Chain

The presently disclosed dispersion comprise platinum family metal catalyst which catalyzes addition reaction of the components alkenyl groups with the said silicon hydride polymer chain. This platinum family metal catalyst may comprise platinum family metals such as platinum, rhodium and iridium, such as chloroplatinic acid, complexes of chloroplatinic acid with various olefins or vinylsiloxane, platinum black, or platinum supported on various carriers. The platinum family metal catalyst may be added in an amount from 1 to 1,000 ppm in terms of platinum family metal content base on the total weight of the components functional groups.

Grafting Silicon Polymer Chain onto the Functional Tails

The present disclosure provides a process of grafting silicon polymer chain comprising Si—H groups on to nanocrystals comprising presently disclosed functional tail, said grafting process may comprise reacting 30 to 90% by weight of nanocrystals, 5 to 50% by weight of silicon hydride, and 1 to 1000 ppm said platinum catalysts in a non-polar solvents, such as hexane, toluene, xylene, the reaction time may vary between 1-120 minutes depending upon the amount of catalysts used, and the reaction temperature may vary between RT –120° C.

The nanocomposites of the present disclosure can be made by curing the silicones by room temperature curing, heat curing, UV curing, IR curing etc. The curing may be carried out by heat-treatment between 40-100° C. for 30 seconds or longer.

The nanocomposites of the present invention may be diluted with organic solvents and then applied to a given substrate, followed by curing according to known methods described above; there-by forming a coating or a film with high transparency. Coating of the composition diluted with an organic solvent can be conducted by known techniques such as spin coating, roll coating, spray coating, dip coating, etc., which are to be selected according to desired application.

Led Encapsulant

The present disclosure provides a light emitting device comprising presently disclosed nanocomposites comprising presently disclosed nanocomposites comprising at least one of silicone capped or silicone grafted nanocomposite or nanocomposites with nanocrystals capped with capping agents comprising hydro-carbon chain. The capping agents may be reactive or non-reactive. Said light emitting device comprises a plurality of light emitting diode dies on a sub-mount wafer, a said nanocomposite layer, a layer with phosphor infused into said nanocomposite, and optionally molding another silicone layer over the phosphor infused layer.

The present disclosure provides a light emitting device comprising presently disclosed nanocomposites comprising presently disclosed nanocomposites comprising at least one of silicone capped or silicone grafted nanocomposite or nanocomposites with nanocrystals capped with capping agents comprising hydro-carbon chain and a commercial silicone. Several commercial silicones, both one-part and two-part can be used, such as Dow Corning phenyl containing silicones—OE-6672, OE-6662, OE-6652 OE-6630, OE-7640, OE-7630 OE-6550, OE-6635LPL, OE6636P, OE-6635, OE-6560, OE-7620, OE-6550, OE-6631, OE-6636, and OE-6551; and dimethyl elastomers OE-6370M, OE-6351 and OE-6370HF. Commercial LED silicones from Momentive Performance Materials suitable for use are dimethyl silicones IVS4312, IVS4622, IVS4632, IVS4542, IVS4546, IVS4742, IVS 4752, XE14-C2042 and high refractive index phenyl containing silicones XE14-C2860, XE14-C3450. Additional suppliers of the LED silicones are Shin Etsu and their products suitable for use are LPS 5547, LPS-3419, LPS-3541, LPS-5538, LPS-3421T, KJR9222, KJR-9226D, KJR-632DA-7, LPS-2428TW and KJR-610.

Optical Measurements

In general, when light propagates through a sample, the light can be absorbed, scattered, or transmitted. In a typical UV-Vis spectrophotometer measurement, only light that emerges in the direction of the measurement light beam is collected by the detector. The transmittance defined by this measurement is $Tn=I/I_0$, where $I_0$ is the power of incident light and I is the power of the light collected by the detector, which includes both transmitted light and light that is scattered into the forward direction. Theoretically the forward direction is defined as the same direction of the incident light, but in reality, the detector usually collects light within a small solid angle around this direction due to the finite size of the detector. This transmittance is called Normal Transmittance, Tn, throughout this disclosure.

Other optical parameters can be derived from the normal transmittance, Tn. Optical density OD is related to Tn as: $OD=-\log(Tn)$; Extinction coefficient k is related to Tn as: $k=-\lambda/4\pi \times \ln(Tn)$, where $\lambda$ is the wavelength of the light. Although optical density and extinction coefficient are often attributed solely to absorption, they are actually the results of both absorption and scattering.

The Diffuse Transmittance, Ts, is defined as all the light power that is transmitted across the sample through scattering divided by the power of the incident light, $Ts=Is/I0$, and it is apparent that the Total Transmittance, T, defined as all the light power that propagates across the sample divided by the power of the incident light, is $T=Tn+Ts$.

Diffuse transmittance Ts and total transmittance are usually measured using an integrating sphere. The difference is that when measuring Ts, the forward transmitted light is blocked from reaching the detector. This will lead to a small error because the blocked beam include a portion of scattered light, with a large integrating sphere, this error can be suppressed to be negligible for all practical purposes.

When measuring normal transmittance, measurements artifacts, such as Fresnel reflections off of various interfaces, needs to be accounted for and removed. This can be taken care of by using a reference, either by measuring the sample and reference side by side in the instrument, or by measuring the sample and reference sequentially and then correcting the data mathematically afterward. For liquid samples, the measurement is typically carried out in a cuvette made of glass, quartz, or plastics, and due to the finite thickness of the cuvette wall, there are four interfaces where reflection may occur. For transparent solvent, usually a cuvette with same path length filled with solvent as the reference will produce results with sufficient accuracy. One method to account for the Fresnel reflections at the interfaces, is to measure the sample in a cuvette against a thinner cuvette filled with the same sample as the reference. For example, a 10 mm path length cuvette against a 5 mm cuvette, both filled with same sample. In this set up, the absorption and scattering recorded is solely contributed from the 5 mm path length of sample, which includes contributions from the solvent and whatever is dispersed in the solvent, usually nanocrystals in the examples of the present disclosure. And the transmittance of sample with any thickness can be easily calculated.

If the solvent itself is highly absorbing using a thick cuvette will not produce accurate result as very little light will reach the detector. For these solvents, a thinner cuvette may be used to reduce the impact of the solvent and allow more light to reach the detector. To account for absorption by the solvent, a thinner cuvette may be used so that the light has the same path length through the solvent. For example if the sample is 10% by volume of the dispersion, then the reference cuvette should be 10% thinner.

To measure the normal transmittance of films, similar care must be taken as the thin films are often measured on top a transparent substrate. Usually using a bare substrate with same material, same quality, and same thickness should produce results with sufficient accuracy. However, a bare substrate has two interfaces and a film coated substrate has three interfaces, so to accurately measure the contribution from the film alone, the ideal reference need to be a substrate coater with a thinner film of same composition. For example, a 10 um thick film on a substrate against a 9 um thick film on a substrate, both film having same composition. In this set up, the absorption and scattering recorded are solely contributed from the 1 um film thickness difference. The transmittance of sample with any thickness can be easily calculated.

In measuring the transmittance of thin film, another complication may arise when the surface quality of the film is good. The interference of the incident light and reflected light creates "ripples" in the measured spectrum. To extract the actual transmittance requires fitting or modeling. One simple procedure is to create "envelope functions" of the spectrum. The upper envelope function is created by interpolate all peaks values of the ripples and the lower envelope function is created by interpolate all valley values of the ripples. The actual transmittance is taken as the average of the two envelop functions.

The refractive index of a film is most commonly measured using ellipsometry, either with fixed or variable angle.

The raw data, namely the relative intensity amplitude change and phase change of two orthogonal polarizations in the reflected beam, is fit by mathematical models to extract the optical parameters of the films. The ellipsometry can measure refractive index, extinction coefficient, both as functions of wavelength, and film thickness. Because ellipsometry is a model based method, the measured value is often dependent on the choice of the model, the material, and the film quality. If the model is fixed and the film composition and processing condition is well controlled, the method usually has high reproducibility. The refractive index of films can also be measured with Abbe refractometer, which measures the refractive index through a set of prisms. The Abbe refractometer can only measure refractive index but not the extinction coefficient and typically cannot measure refractive index higher than 1.7. Also it is difficult to obtain the wavelength dependency and can only measure the refractive in the visible wavelength. The most of accurate method of measuring the RI is to use a hollow prism filled with the sample (if the sample is a liquid) or to form the sample into a prism and measure the deflection angle of a light beam passing through the prism. This method is frequently used with a laser as the source of the light beam. It provides the most accurate results because it is a direct measurement of the refractive index.

TGA Measurement

The $ZrO_2$ nanocrystal loading of the dispersion and films may be measured with thermogravimetric analysis (TGA). In TGA, small amount of sample is subjected to a temperature sweep and the weight of the sample is recorded as a function of temperature. The solvent, polymer, a capping agent, decompose and/or volatilize at different temperatures. The relative weight percentage of these constituent can be calculated from the data.

Packaged LED

A white phosphor converted LED lamp (pc-LED) is composed of an LED chip, which generates blue light, and a phosphor down-conversion layer containing phosphor particles and a binder, usually a silicone binder, preferably a silicone nanocomposite. One example of the present disclosure is to provide an improved binder for coating LEDs and for combining with phosphor particles. The down-conversion layer converts the blue light to longer wavelength and together with un-converted blue light, produces the white appearance. The down conversion layer can be directly placed on top of the chip (on-chip LED), or away from the chip (remote phosphor pc-LED). For on-chip pc-LEDs, sometime a transparent encapsulant dome is placed on top of the phosphor down-conversion layer to direct the output light and to provide protection to the LEDs. LED chips can be placed in a die to be packaged individually, or be produced in an array, called chip-on-board (COB), and packaged en masse. In the disclosure, the terms LED or LED chip refer to bare, unpackaged LED and packaged LED or pc-LED refers to an LED chip together with at least the phosphor down-conversion layer. The down conversion layer can be applied in a number of ways. It can be applied to the chip as a liquid (containing phosphors; silicone monomers, oligomers, resins, and/or polymers; capped nanocrystals; and optionally solvent) which is then cured to form a solid film containing the phosphor particles and the binder. It can also be applied as a pre-formed film. The pre-formed film is made in a separate step where a liquid (containing the binder and phosphor) is applied to a sheet (usually a flexible sheet). The material is then cured to make the pre-formed film. This film is then applied to a wafer containing many LEDs (and then diced to form individual packaged LEDs) or the film is cut and applied to individual bare LEDs to form a packaged.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition, wherein the dispersion has a percent normal transmittance in the range of from 50-85%, or alternatively in the range of 20-40%, or alternatively in the range of 40-60%, or alternatively in the range of 60-80%, or alternatively in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in a 1 cm cuvette at 350 nm in a spectrophotometer. Sample measurements are made by means known by those of ordinary skill to reduce or eliminate contributions from dispersion solvent, interfaces and/or other measurement or equipment related artifacts. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition, wherein the dispersion has a percent total transmittance in the range of from 50-99%, or alternatively in the range of 20-40%, or alternatively in the range of 40-60%, or alternatively in the range of 60-80%, or alternatively in the range 80-99%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals in a 1 cm cuvette as measured in an integrating sphere at 400 nm. Sample measurements are made by means known by those of ordinary skill to reduce or eliminate contributions from dispersion solvent and/or other measurement or equipment related artifacts. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition wherein the solvent dispersion in the 50 weight percent loading, contains less than 25,000 ppm, or alternatively less than 15,000 ppm, or alternatively less than 5,000 ppm, or alternatively less than 1,000 ppm, or alternatively less than 500 ppm, or alternatively less than 250 ppm, or alternatively less than 100 ppm, or alternatively less than 50 ppm of the organic impurities, or alternatively in the range of 5,000-1,000 ppm or alternatively in the range of 1,000-1 ppm, or alternatively in the range of 100 to 0.01 ppm. of at least one organic impurity including alkyls, such as methane, ethane, butane, propane, heptane, or heptane; alcohols, such as methanol, ethanol, butanol, propanol, isopropanol, heptanol; aromatic impurities such as benzene, toluene, furan, and other impurities including orgaosilicones or containing organic functional groups such as ketones, ethers and acids, as measured by chromatography, such as liquid chromatography or gas chromatography using a flame ionization detector and helium as the carrier gas. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

The presently described dispersion advantageously may be maintained in solution for at least 6 months, as described herein. Exemplary dispersions of the present disclosure may be maintained in solution such that after having been passed through a 0.5 µm filter after 6 months of storage the loading (weight percent) of the dispersed, capped nanocrystals are maintained to within 10% (by weight) of the originally dispersed, capped nanocrystals. One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition wherein the dispersion is stable in at least one dispersion solvent in the range of 5-95 weight percent loading in solution, or optionally in the range of 15-85 weight percent loading, or optionally in the range of 25-75 weight percent loading, or optionally in the range of 40-60 weight percent loading and the nanocrystal weight percent loading is maintained to within 10% by weight of the original loading, or alternatively 5%, or alternatively 2%, or alternatively 1%, or alternatively 0.5%, or alternatively 0.1% of the original loading, for at least 1-6 months, such as for at least 2 months, or such as for at least 3 months, such as for at least 4 months, such as for at least 5 months, such as for at least 6 months, such as for as for at least 12 or for at least 24 months, shelf life when stored in the temperature range of 4° C.-25° C., such as when stored under refrigeration or at room temperature, in an amber bottle. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition wherein the percent normal transmittance, after 6 month of shelf life when stored as a 50 weight percent dispersion loading in a temperature range of 4° C.-25° C., in an amber bottle, is within 0-5%, or optionally within 5-10%, or optionally within 10-15% of the original transmittance as measured in a 1 cm cuvette at 350 nm in a spectrophotometer. Sample measurements are made by means known by those of ordinary skill to reduce or eliminate contributions from dispersion solvent, interfaces and/or other measurement or equipment related artifacts. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition wherein the percent total transmittance after 6 month of shelf life when stored at 4° C.-25° C. temperature range decreases by 0-5% as measured in an integrating sphere at 400 nm and a 50% weight loading, or alternatively decreases by 50-10%, or alternatively decreases by 10-15%, or alternatively decreases by 15-20% as measured in an integrating sphere at 400 nm. Sample measurements are made by means known by those of ordinary skill to reduce or eliminate contributions from dispersion solvent, interfaces and/or other measurement or equipment related artifacts. For solvents that have high absorption at 400 nm, the measurement can be made in a composition of the dispersion containing 50 weight percent nanocrystals as measured in using a 1 mm cuvette and mathematically calculating the total transmittance for a 1 cm cuvette. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition wherein the solvent dispersion in the 50 weight percent loading, contains less than 250 parts per million level, or alternatively contains less than 150 ppm, or alternatively less than 50 ppm, or alternatively less than 10 ppm, or alternatively less than 5 ppm of catalyst residue impurities (e,g, platinum metal), as measured by atomic absorption spectroscopy. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition wherein the solvent dispersion in the 5-95% weight loading, or alternatively 5-10% weight loading, or alternatively 10-20% weight loading, or alternatively 20-30% weight loading, or alternatively 30-40% weight loading, or alternatively 40-50% weight loading, or alternatively 50-60% weight loading, or alternatively 60-70% weight loading, or alternatively 70-80% weight loading, or alternatively 80-90% weight loading, or alternatively 90-95% weight loading, contains solvents selected from linear hydrocarbon solvents e.g. hexane, heptane, cyclic hydrocarbon solvents (cyclohexane), aromatic solvents (toluene, xylene), silicone solvents (low molecular weight non-reactive hexamethyldisiloxanes), oxygenated solvents (2-Methoxyethanol). One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition wherein the reactive silicone capping agent is selected from the group of alkenyl functional alkoxysilanes such as vinyltrimethoxysilane, allyltrimethoxysilane, hexenyltrimethoxysilane, and octenyltrimethoxysilane. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition wherein the solvents optionally do not include halogenated solvents (chloroform, methylene chloride), corrosive solvents (tetrahydrofuran, n-methylpyrrolidone). One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition wherein the solvent dispersion contains 50 weight percent loading and wherein the amount of alkoxysilane, or silicone monomer, oligomer, resin and/or polymer that is not covalently bonded to the nanocrystal is less than 25,000 ppm, or alternatively less than 15,000 ppm, or alternatively less than 5,000 ppm, or alternatively less than 1,000 ppm, or alternatively less than 500 ppm, or alternatively less than 250 ppm, or alternatively less than 100 ppm, or alternatively less than 50 ppm, as measured by gas chromatography. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition wherein the dispersion is stable in at least one dispersion solvent in the range of 5-70 weight percent loading in solution, such as 40-60 weight percent loading, or alternatively 20-40 weight percent loading, or alternatively 60-70 weight percent loading, or alternatively 5-20 weight percent loading and after 6 months of storage of the nanocrystals the increase in organic impurities in the dispersed, capped nanocrystals are maintained to within 25 ppm, or alternatively within 50 ppm, or alternatively within 75 ppm, or alternatively within 100 ppm, or alternatively within 125 ppm, or alternatively within 150 ppm, or alternatively within 200 ppm, or alternatively within 250 ppm, or alternatively within 500 ppm of the originally dispersed, capped nanocrystals as measured by chromatography, such as liquid chromatography or gas chromatography using a flame ionization detector and helium as the carrier gas. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition that when stored for 6 months, in amber colored containers, as a 50 weight percent dispersion loading in a temperature range of 4° C.-25° C., has a percent normal transmittance that decreases by 0-5%, or alternatively decreases by 5-10%, or alternatively decreases by 10-15%, or alternatively decreases by 15-20% of the original transmittance as measured in a 1 cm cuvette at 350 nm in a spectrophotometer, and the percent total transmittance decreases by 0-5%, or alternatively decreases by 5-10%, or alternatively decreases by 10-15%, or alternatively decreases by 15-20% as measured in an integrating sphere at 400 nm. Sample measurements are made by means known by those of ordinary skill to reduce or eliminate contributions from dispersion solvent, interfaces and/or other measurement or equipment related artifacts. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition, wherein the dispersion has a percent normal transmittance in the range of from 50-85%, or alternatively in the range of 20-40%, or alternatively in the range of 40-60%, or alternatively in the range of 60-80%, or alternatively in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in a 1 cm cuvette at 350 nm in a spectrophotometer and the percent total transmittance after 6 month of shelf life when stored at 4° C.-24° C. temperature range decreases by 0-5%, or alternatively decreases by 5-10%, or alternatively decreases by 10-15%, or alternatively decreases by 15-20% as measured in an integrating sphere at 400 nm and a 50% weight loading. Sample measurements are made by means known by those of ordinary skill to reduce or eliminate contributions from dispersion solvent, interfaces and/or other measurement or equipment related artifacts. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition, wherein the dispersion has a percent total transmittance in the range of from 50-99%, or alternatively in the range of 20-40%, or alternatively in the range of 40-60%, or alternatively in the range of 60-80%, or alternatively in the range 80-99%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals, and wherein the percent normal transmittance, after 6 month of shelf life when stored as a 50 weight percent dispersion loading in a temperature range of 4° C.-25° C., is within 0-5%, or alternatively decreases by 5-10%, or alternatively decreases by 10-15%, or alternatively decreases by 15-20% of the original transmittance. The total transmittance is measured in a 1 cm cuvette in an integrating sphere at 400 nm, and the percent normal transmittance measured in a 1 cm cuvette at 350 nm in a spectrophotometer. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one solvent, wherein the capped nanocrystals optionally participate in curing with a silicone monomer, oligomer, resin and/or polymer-containing composition, wherein the dispersion has a percent normal transmittance in the range of from 50-99%, or alternatively in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in a 1 cm cuvette at 350 nm in a spectrophotometer, and wherein the reactive silicone capping agent is selected from the group of alkenyl functional alkoxysilanes such as vinylmethoxysilane, allyltrimethoxysilane, hexenyltrimethoxysilane. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one solvent, wherein the capped nanocrystals optionally participate in curing with a silicone monomer, oligomer, resin and/or polymer-containing composition, wherein the dispersion has a percent total transmittance in the range of from 50-99%, or alternatively in the range of 20-40%, or alternatively in the range of 40-60%, or alternatively in the range of 60-80%, or alternatively in the range 80-99%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in an integrating sphere at 400 nm and wherein the reactive silicone capping agent is selected from the group of alkenyl functional alkoxysilanes such as vinylmethoxysilane, allyltrimethoxysilane, hexenyltrimethoxysilane. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition, wherein the dispersion has a percent total transmittance in the range of from 50-99%, or alternatively in the range of 20-40%, or alternatively in the range of 40-60%, or alternatively in the range of 60-80%, or alternatively in the range 80-99%, or alternatively or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in an integrating sphere at 400 nm; and wherein the percent total transmittance after 6 month of shelf life when stored at 4° C.-25° C. temperature range, in an amber bottle, decreases by 0-5%, or alternatively decreases by 50-10%, or alternatively decreases by 10-15%, or alternatively decreases by 15-20% as measured in an integrating sphere at 400 nm. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition, wherein the dispersion has a percent normal transmittance in the range of from 50-99%, or alternatively in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in a 1 cm cuvette at 350 nm in a spectrophotometer, and wherein the percent normal transmittance after 6 month of shelf life when stored at 4° C.-25° C. temperature range, in an amber bottle, decreases by 0-5% as measured in an spectrophotometer at 350 nm at 50% weight loading, or alternatively decreases by 5-10%, or alternatively decreases by 10-15%, or alternatively decreases by 15-20% as measured in an spectrophotometer at 350 nm. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition, wherein the dispersion has a percent total transmittance in the range of from in the range of from 50-99%, or alternatively in the range of 20-40%, or alternatively in the range of 40-60%, or alternatively in the range of 60-80%, or alternatively in the range 80-99%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in an integrating sphere at 400 nm; and wherein the solvent dispersion in the 50 weight percent loading, contains less than 25,000 parts per million level, or alternatively contains less than 15,000 ppm, or alternatively less than 5,000 ppm, or alternatively less than 1,000 ppm, or alternatively less than 500 ppm, or alternatively less than 250 ppm, or alternatively less than 100 ppm, or alternatively less than 50 ppm of the organic impurities of organic impurities (non-silicone) such as anti-solvents heptane, methanol, ethanol; aromatic impurities such as benzaldehyde, benzoic acid, and other impurities containing organic functional groups such as ketones, ethers and acids, as measured by gas chromatography using a flame ionization detector and helium as the carrier gas. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition, wherein the dispersion has a percent normal transmittance as measured in a 1 cm cuvette at 350 nm in a spectrophotometer is in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99%; and wherein the solvent dispersion in the 50 weight percent loading, and contains less than 25,000 parts per million level, or alternatively contains less than 15,000 ppm, or alternatively less than 5,000 ppm, or alternatively less than 1,000 ppm, or alternatively less than 500 ppm, or alternatively less than 250 ppm, or alternatively less than 100 ppm, or alternatively less than 50 ppm of the organic impurities. of organic impurities (non-silicone) such as anti-solvents heptane, methanol, ethanol; aromatic impurities such as benzaldehyde, benzoic acid, and other impurities containing organic functional groups such as ketones, ethers and acids, as measured by gas chromatography using a flame ionization detector and helium as the carrier gas. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition, wherein the dispersion has a percent normal transmittance in the range of from 50-85%, or alternatively in the range of 20-40%, or alternatively in the range of 40-60%, or alternatively in the range of 60-80%, or alternatively in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in a 1 cm cuvette at 350 nm in a spectrophotometer and wherein the amount of alkoxysilane, or silicone monomer, oligomer, resin and/or polymer that is not covalently bonded to the nanocrystal after 6 month of shelf life when stored as a 50 weight percent dispersion loading in a temperature range of 4° C.-25° C., is less than 25,000 ppm, or alternatively less than 15,000 ppm, or alternatively less than 5,000 ppm, or alternatively less than 1,000 ppm, or alternatively less than 500 ppm, or alternatively less than 250 ppm, or alternatively less than 100 ppm, or alternatively less than 50 ppm, as measured by gas chromatography. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition, wherein the dispersion has a percent total transmittance in the range of from 50-99%, or alternatively in the range of 20-40%, or alternatively in the range of 40-60%, or alternatively in the range of 60-80%, or alternatively in the range 80-99%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals, as measured in a 1 cm cuvette in an integrating sphere at 400 nm, and wherein the amount of alkoxysilane, or silicone monomer, oligomer, resin and/or polymer that is not covalently bonded to the nanocrystal after 6 month of shelf life when stored as a 50 weight percent dispersion loading in a temperature range of 4° C.-25° C., is less than 25,000 ppm, or alternatively less than 15,000 ppm, or alternatively less than 5,000 ppm, or alternatively less than 1,000 ppm, or alternatively less than 500 ppm, or alternatively less than 250 ppm, or alternatively less than 100 ppm, or alternatively less than 50 ppm, as measured by gas chromatography. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one reactive silicone capping agent and at least one dispersion solvent, wherein the capped nanocrystals optionally participate in curing with a silicone monomer, oligomer, resin and/or polymer-containing composition, wherein the dispersion has a percent normal transmittance in the range of from 50-85%, or alternatively in the range of 20-40%, or alternatively in the range of 40-60%, or alternatively in the range of 60-80%, or alternatively in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in a 1 cm cuvette at 350 nm in a spectrophotometer, and wherein the dispersion has a percent total transmittance in the range of from 50-99%, or alternatively in the range of 20-40%, or alternatively in the range of 40-60%, or alternatively in the range of 60-80%, or alternatively in the range 80-99%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals, as measured in a 1 cm cuvette in an integrating sphere at 400 nm. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a cured silicone nanocomposite film containing a silicone monomer, oligomer, resin and/or polymer and nanocrystals, which may optionally be capped with at least one reactive silicone capping agent composition, wherein the cured film contains 10-20 weight percent nanocrystals, or alternatively 20-30 weight percent nanocrystals, or alternatively 30-40 weight percent nanocrystals, or alternatively 40-50 weight percent nanocrystals, or alternatively 50-60 weight percent nanocrystals, or alternatively 60-70 weight percent nanocrystals, or alternatively 70-80 weight percent nanocrystals, or alternatively 80-85 weight percent nanocrystals, or alternatively 85-90 weight percent nanocrystals. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a cured silicone nanocomposite film containing a silicone monomer, oligomer, resin and/or polymer and nanocrystals, which may optionally be capped with at least one reactive silicone capping agent composition, wherein the cured film contains 10-20 weight percent nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals, and having a film thickness of 1-10 microns, or alternatively a film thickness of 10-100 microns, or alternatively a film thickness of 100-200 microns, or alternatively a film thickness of 300-

400 microns, or alternatively a film thickness of 500-600 microns, or alternatively a film thickness of 600-700 microns, or alternatively a film thickness of 700-800 microns, or alternatively a film thickness of 900-1000 microns, or alternatively a film thickness of 1-5 millimeters, or alternatively a film thickness of 5-10 millimeters. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a cured silicone nanocomposite film containing a silicone monomer, oligomer, resin and/or polymer and nanocrystals, which may optionally be capped with at least one reactive silicone capping agent composition, wherein the cured film contains 10-20 weight percent of nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals and the films is made by drop-casting technique, or alternatively by a mylar draw down bar, or alternatively by a spin coating technique, or alternatively using a spray technique, or alternatively is made by the dispense method. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a cured silicone nanocomposite film containing a silicone monomer, oligomer, resin and/or polymer and nanocrystals, which may optionally be capped with at least one reactive silicone capping agent composition, wherein the cured film contains 10-20 weight percent of nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals and the film has been cured in the temperature range of 25-50° C., or alternatively in the temperature range of 50-75° C., or alternatively in the temperature range of 75-100° C., or alternatively in the temperature range of 100-125° C., or alternatively in the temperature range of 125-150° C., or alternatively in the temperature range of 150-175° C., or alternatively in the temperature range of 175-200° C. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a cured silicone nanocomposite film containing a silicone monomer, oligomer, resin and/or polymer and nanocrystals, which may optionally be capped with at least one reactive silicone capping agent composition, wherein the cured film contains 1-5 weight percent nanocrystals, or alternatively 5-10 weight percent of nanocrystals, or alternatively 10-20 weight percent nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals, and the cured film has a percent normal transmittance, when measured in a 100 micron thick film at 350 nm in a spectrophotometer is in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99%. Sample measurements are made by means known by those of ordinary skill to reduce or eliminate contributions from substrates and/or other measurement or equipment related artifacts. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a cured silicone nanocomposite film containing a silicone monomer, oligomer, resin and/or polymer and nanocrystals, which may optionally be capped with at least one reactive silicone capping agent composition, wherein the cured film contains 10-20 weight percent of nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals, wherein the film has a percent total transmittance is in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a 100 micron thick film as measured in an integrating sphere at 400 nm. Sample measurements are made by means known by those of ordinary skill to reduce or eliminate contributions from substrates and/or other measurement or equipment related artifacts. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a cured silicone nanocomposite film containing a silicone monomer, oligomer, resin and/or polymer and nanocrystals, which may optionally be capped with at least one reactive silicone capping agent composition, wherein the cured film contains 10-20 weight percent of nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals and the films have percent total transmittance as measured in an integrating sphere, is in the range of 5-10%, or alternatively in the range of 10-20%, or alternatively in the range of 30-40%, or alternatively in the range of 40-50%, or alternatively in the range of 50-60%, or alternatively in the range of 60-70%, or alternatively in the range of 70-80%, or alternatively in the range of 80-90%, or alternatively in the range of 90-99%. Sample measurements are made by means known by those of ordinary skill to reduce or eliminate contributions from substrates and/or other measurement or equipment related artifacts. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a cured silicone nanocomposite film containing a silicone monomer, oligomer, resin and/or polymer and nanocrystals, which may optionally be capped with at least one reactive silicone capping agent composition, wherein the cured film contains 10-20 weight percent of nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals and the films have percent total transmittance is in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a 100 micron thick film as measured in an integrating sphere at 400 nm after thermal aging for 1 week at 200° C. Sample measurements are made by means known by those of ordinary skill to reduce or eliminate contributions from substrates and/or other measurement or equipment related artifacts. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a nanocomposite film containing a silicone monomer, oligomer, resin and/or polymer and nanocrystals, which may optionally be capped with at least one silicone capping agent composition, wherein the cured film contains 10-20 weight percent of nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals and the films have a percent normal transmittance in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a 100 micron thick film as measured in an integrating sphere at 350 nm after thermal aging for 1 week at 200° C. Sample measurements are made by means known by those of ordinary skill to reduce or eliminate contributions from substrates and/or other measurement or equipment related artifacts. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure further provides a light emitting diode (LED) containing the material of the cured silicone nanocomposite film as described herein. The present disclosure provides an LED or other light emitting structure containing a nanocomposite or nanocomposite film as described herein wherein the LED or other light emitting structure generates less heat and/or produces a greater amount of light at the same current and/or more efficiently utilizes energy as compared to a similar LED or other light emitting structure not containing a nanocomposite or nanocomposite film as described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures, wherein the dispersion has a percent normal transmittance in the range of from 50-85%, or alternatively in the range of 20-40%, or alternatively in the range of 40-60%, or alternatively in the range of 60-80%, or alternatively in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in a 1 cm cuvette at 350 nm in a spectrophotometer. Sample measurements are made by means known by those of ordinary skill to reduce or eliminate contributions from dispersion solvent, interfaces and/or other measurement or equipment related artifacts. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures, wherein the dispersion has a percent total transmittance in the range of from 50-99%, or alternatively in the range of 20-40%, or alternatively in the range of 40-60%, or alternatively in the range of 60-80%, or alternatively in the range 80-99%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals in a 1 cm cuvette as measured in an integrating sphere at 400 nm. Sample measurements are made by means known by those of ordinary skill to reduce or eliminate contributions from dispersion solvent and/or other measurement or equipment related artifacts. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures wherein the solvent dispersion in the 50 weight percent loading, contains less than 25,000 ppm, or alternatively less than 15,000 ppm, or alternatively less than 5,000 ppm, or alternatively less than 1,000 ppm, or alternatively less than 500 ppm, or alternatively less than 250 ppm, or alternatively less than 100 ppm, or alternatively less than 50 ppm of the organic impurities, or alternatively in the range of 5,000-1,000 ppm or alternatively in the range of 1,000-1 ppm, or alternatively in the range of 100 to 0.01 ppm. of at least one organic impurity including alkyls, such as methane, ethane, butane, propane, heptane, or heptane; alcohols, such as methanol, ethanol, butanol, propanol, isopropanol, heptanol; aromatic impurities such as benzene, toluene, furan, and other impurities including orgaosilicones or containing organic functional groups such as ketones, ethers and acids, as measured by chromatography, such as liquid chromatography or gas chromatography using a flame ionization detector and helium as the carrier gas. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

The presently described dispersion advantageously may be maintained in solution for at least 6 months, as described herein. Exemplary dispersions of the present disclosure may be maintained in solution such that after having been passed through a 0.5 µm filter after 6 months of storage the loading (weight percent) of the dispersed, capped nanocrystals are maintained to within 10% (by weight) of the originally dispersed, capped nanocrystals. One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures wherein the dispersion is stable in at least one dispersion solvent in the range of 5-95 weight percent loading in solution, or optionally in the range of 15-85 weight percent loading, or optionally in the range of 25-75 weight percent loading, or optionally in the range of 40-60 weight percent loading and the nanocrystal weight percent loading is maintained to within 10% by weight of the original loading, or alternatively 5%, or alternatively 2%, or alternatively 1%, or alternatively 0.5%, or alternatively 0.1% of the original loading, for at least 1-6 months, such as for at least 2 months, or such as for at least 3 months, such as for at least 4 months, such as for at least 5 months, such as for at least 6 months, such as for as for at least 12 or for at least 24 months, shelf life when stored in the temperature range of 4° C.-25° C., such as when stored under refrigeration or at room temperature, in an amber bottle. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures wherein the percent normal transmittance, after 6 month of shelf life when stored as a 50 weight percent dispersion loading in a temperature range of 4° C.-25° C., in an amber bottle, is within 0-5%, or optionally within 5-10%, or optionally within 10-15% of the original transmittance as measured in a 1 cm cuvette at 350 nm in a spectrophotometer. Sample measurements are made by means known by those of ordinary skill to reduce or eliminate contributions from dispersion solvent, interfaces and/or other measurement or equipment related artifacts. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures wherein the percent total transmittance after 6 month of shelf life when stored at 4° C.-25° C. temperature range decreases by 0-5% as measured in an integrating sphere at 400 nm and a 50% weight loading, or alternatively decreases by 50-10%, or alternatively decreases by 10-15%, or alternatively decreases by 15-20% as measured in an integrating sphere at 400 nm. Sample measurements are made by means known by those of ordinary skill to reduce or eliminate contributions from dispersion solvent, interfaces and/or other measurement or equipment related artifacts. For solvents that have high absorption at 400 nm, the measurement can be made in a composition of the dispersion containing 50 weight percent nanocrystals as measured in using a 1 mm cuvette and mathematically calculating the total transmittance for a 1 cm cuvette. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures wherein the solvent dispersion in the 50 weight percent loading, contains less than 250 parts per million level, or alternatively contains less than 150 ppm, or alternatively less than 50 ppm, or alternatively less than 10 ppm, or alternatively less than 5 ppm of catalyst residue impurities (e,g, platinum metal), as measured by atomic absorption spectroscopy. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures wherein the solvent dispersion in the 5-95% weight loading, or alternatively 5-10% weight loading, or alternatively 10-20% weight loading, or alternatively 20-30% weight loading, or alternatively 30-40% weight loading, or alternatively 40-50% weight loading, or alternatively 50-60% weight loading, or alternatively 60-70% weight loading, or alternatively 70-80% weight loading, or alternatively 80-90% weight loading, or alternatively 90-95% weight loading, contains solvents selected from linear hydrocarbon solvents e.g. hexane, heptane, cyclic hydrocarbon solvents (cyclohexane), aromatic solvents (toluene, xylene), silicone solvents (low molecular weight non-reactive hexamethyldisiloxanes), oxygenated solvents (2-Methoxyethanol). One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures wherein the reactive silicone capping agent is selected from the group of alkenyl functional alkoxysilanes such as vinyltrimethoxysilane, allyltrimethoxysilane, hexenyltrimethoxysilane, and octenyltrimethoxysilane. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures wherein the solvents optionally do not include halogenated solvents (chloroform, methylene chloride), corrosive solvents (tetrahydrofuran, n-methylpyrrolidone). One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures wherein the solvent dispersion contains 50 weight percent loading and wherein the amount of alkoxysilane, or silicone monomer, oligomer, resin and/or polymer that is not covalently bonded to the nanocrystal is less than 25,000 ppm, or alternatively less than 15,000 ppm, or alternatively less than 5,000 ppm, or alternatively less than 1,000 ppm, or alternatively less than 500 ppm, or alternatively less than 250 ppm, or alternatively less than 100 ppm, or alternatively less than 50 ppm, as measured by gas chromatography. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures wherein the dispersion is stable in at least one dispersion solvent in the range of 5-70 weight percent loading in solution, such as 40-60 weight percent loading, or alternatively 20-40 weight percent loading, or alternatively 60-70 weight percent loading, or alternatively 5-20 weight percent loading and after 6 months of storage of the nanocrystals the increase in organic impurities in the dispersed, capped nanocrystals are maintained to within 25 ppm, or alternatively within 50 ppm, or alternatively within 75 ppm, or alternatively within 100 ppm, or alternatively within 125 ppm, or alternatively within 150 ppm, or alternatively within 200 ppm, or alternatively within 250 ppm, or alternatively within 500 ppm of the originally dispersed, capped nanocrystals as measured by chromatography, such as liquid chromatography or gas chromatography using a flame ionization detector and helium as the carrier gas. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures that when stored for 6 months, in amber colored containers, as a 50 weight percent dispersion loading in a temperature range of 4° C.-25° C., has a percent normal transmittance that decreases by 0-5%, or alternatively decreases by 5-10%, or alternatively decreases by 10-15%, or alternatively decreases by 15-20% of the original transmittance as measured in a 1 cm cuvette at 350 nm in a spectrophotometer, and the percent total transmittance decreases by 0-5%, or alternatively decreases by 5-10%, or alternatively decreases by 10-15%, or alternatively decreases by 15-20% as measured in an integrating sphere at 400 nm. Sample measurements are made by means known by those of ordinary skill to reduce or eliminate contributions from dispersion solvent, interfaces and/or other measurement or equipment related artifacts. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures, wherein the dispersion has a percent normal transmittance in the range of from 50-85%, or alternatively in the range of 20-40%, or alternatively in the range of 40-60%, or alternatively in the range of 60-80%, or alternatively in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in a 1 cm cuvette at 350 nm in a spectrophotometer and the percent total transmittance after 6 month of shelf life when stored at 4° C.-24° C. temperature range decreases by 0-5%, or alternatively decreases by 5-10%, or alternatively decreases by 10-15%, or alternatively decreases by 15-20% as measured in an integrating sphere at 400 nm and a 50% weight loading. Sample measurements are made by means known by those of ordinary skill to reduce or eliminate contributions from dispersion solvent, interfaces and/or other measurement or equipment related artifacts. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures, wherein the dispersion has a percent total transmittance in the range of from 50-99%, or alternatively in the range of 20-40%, or alternatively in the range of 40-60%, or alternatively in the range of 60-80%, or alternatively in the range 80-99%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals, and wherein the percent normal transmittance, after 6 month of shelf life when stored as a 50 weight percent dispersion loading in a temperature range of 4° C.-25° C., is within 0-5%, or alternatively decreases by 5-10%, or alternatively decreases by 10-15%, or alternatively decreases by 15-20% of the original transmittance. The total transmittance is measured in a 1 cm cuvette in an integrating sphere at 400 nm, and the percent normal transmittance measured in a 1 cm cuvette at 350 nm in a spectrophotometer. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one solvent, wherein the capped nanocrystals optionally are incorporated into with a silicone monomer, oligomer, resin and/or polymer-containing composition as it cures, wherein the dispersion has a percent normal transmittance in the range of from 50-99%, or alternatively in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in a 1 cm cuvette at 350 nm in a spectrophotometer, and wherein the reactive silicone capping agent is selected from the group of alkenyl functional alkoxysilanes such as vinylmethoxysilane, allyltrimethoxysilane, hexenyltrimethoxysilane. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one solvent, wherein the capped nanocrystals optionally are incorporated into with a silicone monomer, oligomer, resin and/or polymer-containing composition as it cures, wherein the dispersion has a percent total transmittance in the range of from 50-99%, or alternatively in the range of 20-40%, or alternatively in the range of 40-60%, or alternatively in the range of 60-80%, or alternatively in the range 80-99%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in an integrating sphere at 400 nm and wherein the reactive silicone capping agent is selected from the group of alkenyl functional alkoxysilanes such as vinylmethoxysilane, allyltrimethoxysilane, hexenyltrimethoxysilane. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures, wherein the dispersion has a percent total transmittance in the range of from 50-99%, or alternatively in the range of 20-40%, or alternatively in the range of 40-60%, or alternatively in the range of 60-80%, or alternatively in the range 80-99%, or alternatively or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in an integrating sphere at 400 nm; and wherein the percent total transmittance after 6 month of shelf life when stored at 4° C.-25° C. temperature range, in an amber bottle, decreases by 0-5%, or alternatively decreases by 50-10%, or alternatively decreases by 10-15%, or alternatively decreases by 15-20% as measured in an integrating sphere at 400 nm. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures, wherein the dispersion has a percent normal transmittance in the range of from 50-99%, or alternatively in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in a 1 cm cuvette at 350 nm in a spectrophotometer, and wherein the percent normal transmittance after 6 month of shelf life when stored at 4° C.-25° C. temperature range, in an amber bottle, decreases by 0-5% as measured in an spectrophotometer at 350 nm at 50% weight loading, or alternatively decreases by 5-10%, or alternatively decreases by 10-15%, or alternatively decreases by 15-20% as measured in an spectrophotometer at 350 nm. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures, wherein the dispersion has a percent total transmittance in the range of from in the range of from 50-99%, or alternatively in the range of 20-40%, or alternatively in the range of 40-60%, or alternatively in the range of 60-80%, or alternatively in the range 80-99%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in an integrating sphere at 400 nm; and wherein the solvent dispersion in the 50 weight percent loading, contains less than 25,000 parts per million level, or alternatively contains less than 15,000 ppm, or alternatively less than 5,000 ppm, or alternatively less than 1,000 ppm, or alternatively less than 500 ppm, or alternatively less than 250 ppm, or alternatively less than 100 ppm, or alternatively less than 50 ppm of the organic impurities of organic impurities (non-silicone) such as anti-solvents heptane, methanol, ethanol; aromatic impurities such as benzaldehyde, benzoic acid, and other impurities containing organic functional groups such as ketones, ethers and acids, as measured by gas chromatography using a flame ionization detector and helium as the carrier gas. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures, wherein the dispersion has a percent normal transmittance as measured in a 1 cm cuvette at 350 nm in a spectrophotometer is in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99%; and wherein the solvent dispersion in the 50 weight percent loading, and contains less than 25,000 parts per million level, or alternatively contains less than 15,000 ppm, or alternatively less than 5,000 ppm, or alternatively less than 1,000 ppm, or alternatively less than 500 ppm, or alternatively less than 250 ppm, or alternatively less than 100 ppm, or alternatively less than 50 ppm of the organic impurities. of organic impurities (non-silicone) such as anti-solvents heptane, methanol, ethanol; aromatic impurities such as benzaldehyde, benzoic acid, and other impurities containing organic functional groups such as ketones, ethers and acids, as measured by gas chromatography using a flame ionization detector and helium as the carrier gas. For solvents that have high absorption at 350 nm, the measurement can be made in a composition of the dispersion containing 50 weight percent nanocrystals as measured in using a 1 mm cuvette and mathematically calculating the normal transmittance for a 1 cm cuvette. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures, wherein the dispersion has a percent normal transmittance in the range of from 50-85%, or alternatively in the range of 20-40%, or alternatively in the range of 40-60%, or alternatively in the range of 60-80%, or alternatively in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in a 1 cm cuvette at 350 nm in a spectrophotometer and wherein the amount of alkoxysilane, or silicone monomer, oligomer, resin and/or polymer that is not covalently bonded to the nanocrystal after 6 month of shelf life when stored as a 50 weight percent dispersion loading in a temperature range of 4° C.-25° C., is less than 25,000 ppm, or alternatively less than 15,000 ppm, or alternatively less than 5,000 ppm, or alternatively less than 1,000 ppm, or alternatively less than 500 ppm, or alternatively less than 250 ppm, or alternatively less than 100 ppm, or alternatively less than 50 ppm, as measured by gas chromatography. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures, wherein the dispersion has a percent total transmittance in the range of from 50-99%, or alternatively in the range of 20-40%, or alternatively in the range of 40-60%, or alternatively in the range of 60-80%, or alternatively in the range 80-99%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals, as measured in a 1 cm cuvette in an integrating sphere at 400 nm, and wherein the amount of alkoxysilane, or silicone monomer, oligomer, resin and/or polymer that is not covalently bonded to the nanocrystal after 6 month of shelf life when stored as a 50 weight percent dispersion loading in a temperature range of 4° C.-25° C., is less than 25,000 ppm, or alternatively less than 15,000 ppm, or alternatively less than 5,000 ppm, or alternatively less than 1,000 ppm, or alternatively less than 500 ppm, or alternatively less than 250 ppm, or alternatively less than 100 ppm, or alternatively less than 50 ppm, as measured by gas chromatography. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a dispersion containing nanocrystals capped with at least one silicone capping agent and at least one dispersion solvent, wherein the capped nanocrystals optionally are incorporated into with a silicone monomer, oligomer, resin and/or polymer-containing composition as it cures, wherein the dispersion has a percent normal transmittance in the range of from 50-85%, or alternatively in the range of 20-40%, or alternatively in the range of 40-60%, or alternatively in the range of 60-80%, or alternatively in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals as measured in a 1 cm cuvette at 350 nm in a spectrophotometer, and wherein the dispersion has a percent total transmittance in the range of from 50-99%, or alternatively in the range of 20-40%, or alternatively in the range of 40-60%, or alternatively in the range of 60-80%, or alternatively in the range 80-99%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a composition of the dispersion containing 50 weight percent nanocrystals, as measured in a 1 cm cuvette in an integrating sphere at 400 nm. Sample measurements are made by means known by those of ordinary skill to reduce or eliminate contributions from dispersion solvent and/or other measurement or equipment related artifacts using a reference sample. One example of the present disclosure further provides adding the silicone monomer, oligomer, resin and/or polymers to the dispersion and/or phosphors to the dispersion, and then using the dispersion to make packaged LEDs. Further included herein are packaged LEDs containing dispersions or films made from the dispersions, optionally containing phosphors, described herein.

One example of the present disclosure provides a cured silicone nanocomposite film containing a silicone monomer, oligomer, resin and/or polymer and nanocrystals, which may optionally be capped with at least one silicone capping agent composition, wherein the cured film contains 10-20 weight percent nanocrystals, or alternatively 20-30 weight percent nanocrystals, or alternatively 30-40 weight percent nanocrystals, or alternatively 40-50 weight percent nanocrystals, or alternatively 50-60 weight percent nanocrystals, or alternatively 60-70 weight percent nanocrystals, or alternatively 70-80 weight percent nanocrystals, or alternatively 80-85 weight percent nanocrystals, or alternatively 85-90 weight percent nanocrystals. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a cured silicone nanocomposite film containing a silicone monomer, oligomer, resin and/or polymer and nanocrystals, which may optionally be capped with at least one silicone capping agent composition, wherein the cured film contains 10-20 weight percent nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals, and having a film thickness of 1-10 microns, or alternatively a film thickness of 10-100 microns, or alternatively a film thickness of 100-200 microns, or alternatively a film thickness of 300-400 microns, or alternatively a film thickness of 500-600 microns, or alternatively a film thickness of 600-700 microns, or alternatively a film thickness of 700-800 microns, or alternatively a film thickness of 900-1000 microns, or alternatively a film thickness of 1-5 millimeters, or alternatively a film thickness of 5-10 millimeters. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a cured silicone nanocomposite film containing a silicone monomer, oligomer, resin and/or polymer and nanocrystals, which may optionally be capped with at least one silicone capping agent composition, wherein the cured film contains 10-20 weight percent of nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals and the films is made by dropcasting technique, or alternatively by a mylar draw down bar, or alternatively by a spin coating technique, or alternatively using a spray technique, or alternatively is made by the dispense method. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a cured silicone nanocomposite film containing a silicone monomer, oligomer, resin and/or polymer and nanocrystals, which may optionally be capped with at least one silicone capping agent composition, wherein the cured film contains 10-20 weight percent of nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals and the film has been cured in the temperature range of 25-50° C., or alternatively in the temperature range of 50-75° C., or alternatively in the temperature range of 75-100° C., or alternatively in the temperature range of 100-125° C., or alternatively in the temperature range of 125-150° C., or alternatively in the temperature range of 150-175° C., or alternatively in the temperature range of 175-200° C. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a cured silicone nanocomposite film containing a silicone monomer, oligomer, resin and/or polymer and nanocrystals, which may optionally be capped with at least one silicone capping agent composition, wherein the cured film contains 1-5 weight percent nanocrystals, or alternatively 5-10 weight percent nanocrystals, or alternatively 10-20 weight percent nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals, and the cured film has a percent normal transmittance, when measured in a 100 micron thick film at 350 nm in a spectrophotometer is in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99%.

Sample measurements are made by means known by those of ordinary skill to reduce or eliminate contributions from substrates and/or other measurement or equipment related artifacts. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a cured silicone nanocomposite film containing a silicone monomer, oligomer, resin and/or polymer and nanocrystals, which may optionally be capped with at least one silicone capping agent composition, wherein the cured film contains 10-20 weight percent of nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals, wherein the film has a percent total transmittance is in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a 100 micron thick film as measured in an integrating sphere at 400 nm. Sample measurements are made by means known by those of ordinary skill to reduce or eliminate contributions from substrates and/or other measurement or equipment related artifacts. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a cured silicone nanocomposite film containing a silicone monomer, oligomer, resin and/or polymer and nanocrystals, which may optionally be capped with at least one silicone capping agent composition, wherein the cured film contains 10-20 weight percent of nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals and the films have percent total transmittance as measured in an integrating sphere, is in the range of 5-10%, or alternatively in the range of 10-20%, or alternatively in the range of 30-40%, or alternatively in the range of 40-50%, or alternatively in the range of 50-60%, or alternatively in the range of 60-70%, or alternatively in the range of 70-80%, or alternatively in the range of 80-90%, or alternatively in the range of 90-99%. Sample measurements are made by means known by those of ordinary skill to reduce or eliminate contributions from substrates and/or other measurement or equipment related artifacts. One example of the present disclosure further provides incorporating the cured silicone nanocomposite film to make packaged LEDs. Further included herein are packaged LEDs containing cured silicone nanocomposites additionally containing phosphors, described herein.

One example of the present disclosure provides a cured silicone nanocomposite film containing a silicone monomer, oligomer, resin and/or polymer and nanocrystals, which may optionally be capped with at least one silicone capping agent composition, wherein the cured film contains 10-20 weight percent of nanocrystals, or alternatively in the 20-30 weight percent of nanocrystals, or alternatively in the 30-40 weight percent of nanocrystals, or alternatively in the 40-50 weight percent of nanocrystals, or alternatively in the 50-60 weight percent of nanocrystals, or alternatively in the 60-70 weight percent of nanocrystals, or alternatively in the 70-80 weight percent of nanocrystals, or alternatively in the 80-85 weight percent of nanocrystals, or alternatively in the 85-90 weight percent of nanocrystals and the films have percent total transmittance is in the range of 5-10%, or alternatively in the range of 10-15%, or alternatively in the range of 15-20%, or alternatively in the range of 20-25%, or alternatively in the range of 25-30%, or alternatively in the range of 30-35%, or alternatively in the range of 35-40%, or alternatively in the range of 40-45%, or alternatively in the range of 45-50%, or alternatively in the range of 50-55%, or alternatively in the range of 55-60%, or alternatively in the range of 60-65%, or alternatively in the range of 65-70%, or alternatively in the range of 70-75%, or alternatively in the range of 75-80%, or alternatively in the range of 80-85% or alternatively in the range of 85-90%, or alternatively in the range of 90-95%, or alternatively in the range of 95-99% in a 100 micron thick film as measured in an integrating sphere at 400 nm after thermal aging for 1 week at 200° C. Sample measurements are made by means known by those of ordinary skill to reduce or eliminate contributions from substrates and/or other measurement or equipment related artifacts. One example of the present disclosure further provides incorporating the cured silicone nanocomposite film to make packaged LEDs. Further included herein are packaged LEDs containing cured silicone nanocomposites additionally containing phosphors, described herein.

EXAMPLES

These are exemplary non-limiting examples of presently disclosed technology.

Example 1. Synthesis of Silicone Capping Agent

In this example, presently disclosed silicone capping agent is synthesized via reacting vinyltrimethoxysilane (SIV922.0, Gelest) with monohydride terminated polydimethyl siloxane (MCR-H07 Gelest) having a molecular weight of 800-900 with an equivalent molar ratio of SIV922.0 to MCR-H07 of 1 to 1.05 in the presence of platinum catalyst (SIP6830.3 Gelest) at 100 ppm level. Specifically, 75 g monohydride terminated polydimethyl siloxane (MCR-H07 Gelest) and 15 g vinyltrimethoxysilane (SIV922.0, Gelest) are added to a round-bottom flask equipped with a stirrer and nitrogen purge. Next 100 ppm of Pt catalyst is added to the round-bottom flask at room temperature. Temperature of the reaction mixture starts to increase. The reaction mixture is heated for 1 hour at 45 degree C. To confirm the reaction is complete, an infrared spectrum is checked for the absence of SiH peak at 2126 cm-1 wavenumbers. Active carbon is then added into the solution and stirred for 2 hours to facilitate removal of platinum catalyst. The reaction mixture is filtered. This solution forms the silicone capping agent.

The silicone capping agent may be synthesized by replacing MCR-H07 with one of MCR-H11 or other monohydride functional PDMS with varying chain lengths or monohydride functional polymethylphenylsiloxanes with varying chain lengths or monohydride functional polydiphenylsiloxanes with varying chain lengths The silicone capping agent may be synthesized by replacing Vinyltrimethoxysilane (SIV922.0, Gelest) with allyltrimethoxysilane or octyltrimethoxysilane. The molar ratios of the monohydride functional siloxane to the alkenyltrimethoxy silane may be 1:1 or off ratio by 5%, or off ratio by 10%. The reaction time may be 1 min-3 h at reaction temperature in the range of ambient to 125 deg C.

Example 2. Zirconia Nanocrystals Capped with Dual Capping Agents

In order to make the as-synthesized $ZrO_2$ nanocrystals compatible in silicone polymers, the nanocrystal surface is modified with siloxane ligands by capping with at least one silicone capping agent, followed by a vinyl-functional silane. The siloxane portion aids in the dispersion of the nanocrystals in the silicone polymer and the vinyl portion reacts with the hydride functional group of the silicone polymer to allow more interaction between the nanocrystal and the polymer.

At least one of trimethoxysilane terminated siloxanes from example 1 are reacted with $ZrO_2$ nanocrystals dispersed in toluene or xylene by heating at RT –100 C between 5 minutes to 5 hours. After the allotted heating time, at least one of alkenyl containing silanes are added to the solution and heated for another 5 min to 5 hours at RT –100 C. Once the reaction is complete, the solution is cooled to room temperature. The nanocrystals are collected by precipitation using polar solvents such as methanol or ethanol. These surface modified nanocrystals are washed through a process of re-dispersion and precipitation using solvents such as toluene, hexane, methanol and ethanol. The precipitated nanocrystals are dried under vacuum for 12 hours to give siloxane and vinyl silane containing $ZrO_2$ nanocrystals ready for use in silicone polymers.

The ratio of siloxane to vinyl dual capping agents on the nanocrystal surface can be controlled by the amount of ligands added during synthesis.

The following table shows the possibility for synthesis of capping agents by varying the ratios of dual capping agents as shown in Table 1

TABLE 1

| Ratio's of dual capping used in capping reaction in Example 2 | | |
|---|---|---|
| Amount NCs | Silicone Capping Agent (Amount) | Vinyl Capping Agent. VTMS (Amount) |
| 60 g | (30 g) | (10 g) |
| 60 g | (5 g) | (50 g) |
| 60 g | (15 g) | (50 g) |
| 60 g | (30 g) | (50 g) |
| 60 g | (50 g) | (50 g) |

Figure 10:
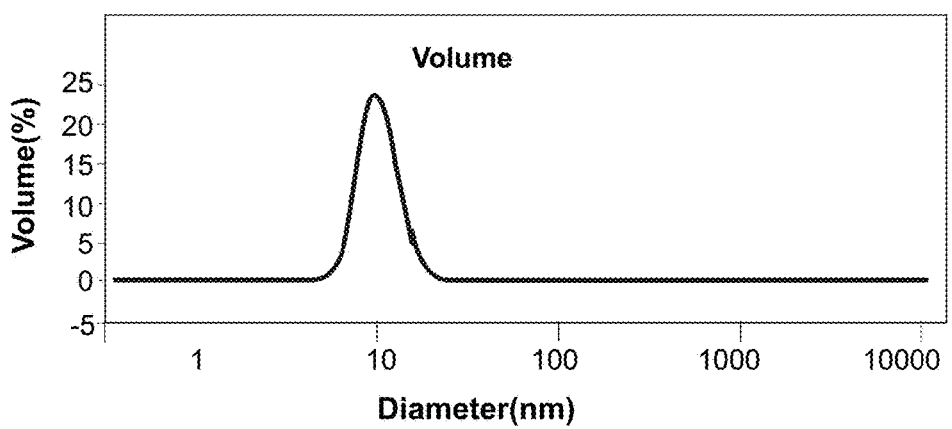
FIG. 10 shows a Dynamic Light Scattering measurement for a 50 weight percent zirconia nanocrystal dispersion in xylene.
Figure 11:
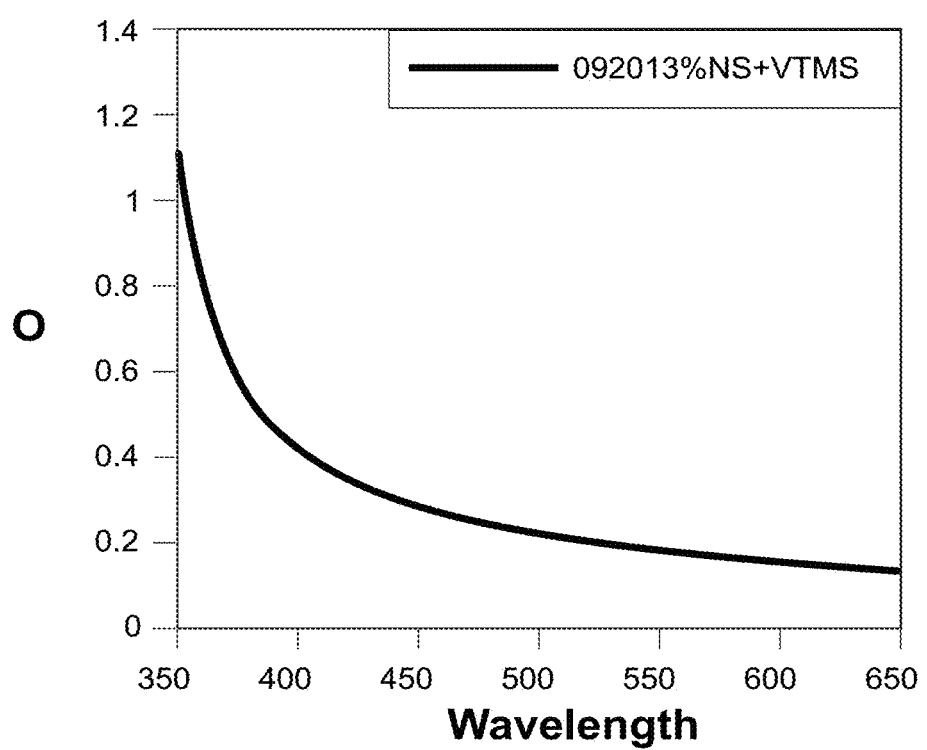
FIG. 11 shows an absorbance measurement for 50 weight percent zirconia nanocrystal dispersion in xylene.
Figure 12:
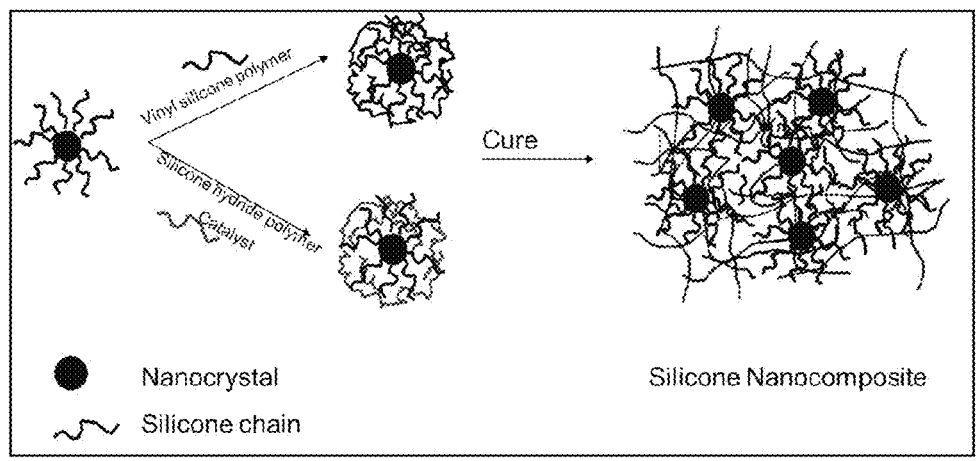
FIG. 12 shows an exemplary Strategy One for forming silicone nanocomposites comprising Siloxane/silicone capped nanocrystals.

Example 3. Zirconia Nanocrystals Capped with Dual Capping Agents Octyltrimethoxysilane and Vinyltrimethoxylsilane Octyltrimethoxysilane (SI06715.5 Gelest) is injected into a reaction vessel (typically a round bottom flask) containing the zirconia nanocrystals in nonpolar solvent, like toluene and heptane. Typically, 30 g of the capping agent is added to a round bottom flask which holds the reaction mixture containing ~60 g of as-synthesized $ZrO2$ nanocrystals in 400 g toluene. During the addition of the capping agent the mixture is stirred continuously. The suspension is heated to 100° C. and kept at that temperature while continuing to stir for 30 minutes. 10 g of the second capping agent, vinyltrimethoxylsilane (SIV922.0, Gelest), is added into the mixture with continuous stirring. The suspension is heated to 100° C. and kept at that temperature while continuing to stir for 30 minutes. Afterwards, the reaction is allowed to cool to room temperature. The product mixture is washed with acetone and the precipitate is collected and dried. The dried precipitate is the dual capped nanocrystals. The nanocrystals are dispersed into toluene to make a 50 wt % nanocrystal solution. The nanocrystals are characterized by DLS and absorbance measurements, see FIGS. 10 and 11.

Example 3a

To make 80 weight percent zirconia loaded silicone nanocomposite material with dual capped zirconia nanocrystals from example 3 the following procedure was followed. 0.03 gram of polydimethyl silicon hydride (HMS-301 from Gelest) is diluted in 0.5 gram toluene and is added to the above solution with 100 ppm of Pt catalyst in reference to the weight of silicone polymer, and the solution is stirred and heated at 90° C. for another 30 mins. 0.22 gram of PMV-9925 vinyl-terminated phenyl-containing silicone polymer (Gelest) is then added into the above solution, while stirring and 90° C. heating for another 20 min. After 20 minutes the solution is out of the oil bath and it begins to turn viscous gradually. Within 1 hour, the solution becomes thick but still flow-able and drop-cast films were made by pipetting a small amount of the solution on a glass slide and heating the glass slide on a hotplate at 50 C for 30 minutes.

Example 3b

Figure 9:
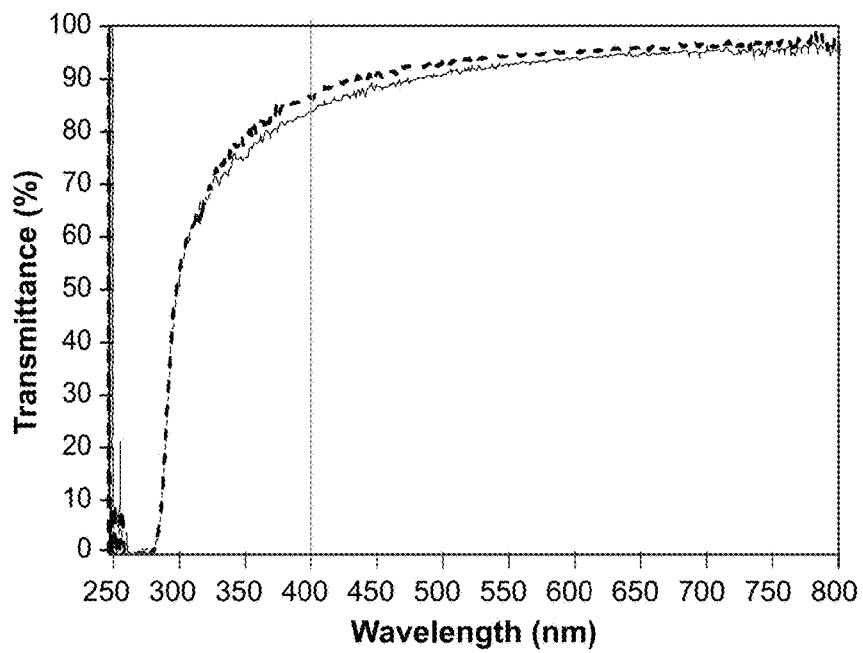
FIG. 9 shows a percent transmittance curve for silicone nanocomposite in example 3b before (80.5% T at 400 nm) and after (82.0% T at 400 nm) heat treatment at 250 c for 1 minute.

To make 80 weight percent zirconia loaded silicone nanocomposite material with dual capped zirconia nanocrystals from example 3 the following procedure was followed (methyl, phenyl) containing silicon hydride, HPM-502 from Gelest, is diluted in toluene to make a 50 wt % silicon hydride solution. Vinyl functional silicone, PMV-9925 from Gelest, is diluted in toluene to make a 50 wt % vinyl functional silicone solution. 3.1 gram of HPM-502 solution is added to 92.25 gram of nanocrystal solution along with 100 ppm of Pt catalyst in reference to the weight of silicon hydride. The solution is stirred and heated at 70° C. for 15 min. 23.1 gram of PMV-9925 solution is then added into the above solution, while stirring at 70° C. for another 10 min. Remove the solution from the heating and wait for 30 min. This suspension is coated onto glass slides via drawbar or spin-cast. The nanocomposite films are cured by baking at 50° C. for 30 min. Films made with such formulation show little or none yellowing and the optical transmittance from 400-800 nm are above 80% with a thickness of 50 microns. After the solder reflow, 250° C. 1 minute in air, the films retain optical transmittance from 400-800 nm with % T above 80%, as shown in as shown in Table 2 below and FIG. 9.

TABLE 2

Percent transmission values for silicone nanocomposite in example 3b

|  | % T 400 nm |
|---|---|
| Initial | 80.5 |
| After heat treatment at 250 C. for 1 minute | 82.0 |

Example 4. Dual Silicone Capped Nanocrystals

Dual capped ZrO2 nanocrystals as described in Example 2 can be further treated with hydride containing silicone to react with the reactive groups such as vinyl groups on the nanocrystals. The hydride containing silicones may be monohydride terminated polydimethylsiloxane; or monohydride terminated polymethylphenylsiloxane; or monohydride terminated polydiphenylsiloxane; both ends hydride terminated polydimethylsiloxane; or both ends hydride terminated polymethylphenylsiloxane; or monohydride terminated polydiphenylsiloxane; or polymethylhydrosiloxanes that are hydride terminated or trimethylsiloxy terminated; or polyphenylhydrosiloxanes that are hydride terminated or trimethylsiloxy terminated; or copolymers and combinations thereof.

The hydride containing silicones may be one of (45-50% METHYLHYDROSILOXANE)-PHENYLMETHYLSILOXANE COPOLYMER, HYDRIDE TERMINATED; POLYPHENYL(DIMETHYLHYDROSILOXY)SILOXANE, HYDRIDE TERMINATED; POLYPHENYLMETHYLSILOXANE, HYDRIDE TERMINATED; HYDRIDE TERMINATED POLYDIMETHYLSILOXANE, with MW from 300 to 100,000; POLYMETHYLHYDROSILOXANE, TRIMETHYLSILYL TERMINATED; (25-35% METHYLHYDROSILOXANE)-DIMETHYLSILOXANE COPOLYMER, TRIMETHYLSILOXANE TERMINATED; HYDRIDE TERMINATED POLYDIMETHYLSILOXANE; HYDRIDE TERMINATED POLYDIMETHYLSILOXANE; MONOHYDRIDE TERMINATED POLYDIMETHYLSILOXANE; Gelest HPM-502; Gelest HDP-111; Gelest PMS-H03; Gelest DMS-H11; Gelest HMS-991; Gelest HMS-301; Gelest MCR-H21; Gelest PMS-H11; Gelest DMS-H25; Gelest DMS-H03; Gelest DMS-H31; Gelest MCR-H07; or Gelest MCR-H11.

Example 5. Silicone Nanocomposite from Dual Capped Nanocrystals Containing Silicone Capping Agents To make 80 weight percent zirconia loaded silicone nanocomposite material with dual capped zirconia nanocrystals the following procedure was followed:
In a round bottom flask fitted with a condenser and stirrer add 73 parts of nanocrystals dispersed in toluene at 50 wt % loading and 18 parts of HPM502. Start stirring. Add 9 parts of a 350 ppm solution of SIP6830.3 in toluene to the reaction mixture. Heat at 70° C. for 15 minutes, with continuous stirring. Cool to ambient and add 1 part of vinyl functional (methyl,phenyl) silicone PMV 9925. Heat the mixture for 5 minutes at 70 C with continuous stirring. Cool to room temperature. Apply a thin coating of the solution on a glass slide at thickness of 50-100 microns. Place glass slide on hot plate at 50 C for 20 minutes. Transfer glass slide to a hot plate at 100 C and cure the film for 30 minutes. Cured film is optically clear.

Example 6. Commercial Silicone OE-6636 Nanocomposite with Dual Capped Nanocrystals and HPM-502 at 80 Weight Percent Loading In a 40 ml vial, add the 4.80 g of dual capped nanocrystals (50 weight percent in xylene). Siloxane functional capping agent of the silicone capped nanocrystals is formed through the process described in example 1 from the reaction of vinyltrimethoxy silane and MCR-$H_{O7}$. The second capping agent of the nanocrystals is allyltrimethoxy silane. Then add 0.60 g of a 50 weight percent solution of HPM-502 in xylene. Using a magnetic stir bar, mix at room temperature for 2 min at 260 rpm. Mixture may appear hazy. Add 0.09 g of 350 ppm solution of platinum catalyst SIP6830.3 in xylene. Continue mixing at room temperature for 2 min at 260 rpm. Transfer the vial to a pre-heated oil bath to 70 C. Heat the mixture at 70 C for 30 min with stirring at 260 rpm. Cool down the mixture by letting it stand with no stirring at room temperature for 10 minutes. To the cooled mixture add 0.40 g of a 50 weight percent solution of OE-6636-Part B in xylene. Stir for 2 min at 260 rpm. Add 0.20 g of a 50 weight percent solution of OE-6636-Part A in xylene to the mixture and stir for 2 min at 260 rpm. Pre-heat an oil bath to 50 C. Place the mixture in the 50 C oil bath and heat for 240±30 min. Ensure the liquid level of the mixture in the vial is completely submerged in the oil. Viscosity of mixture will increase over time. Using a pipette, drop cast the reacted mixture onto a glass slide. Break up any bubbles that form on the glass slide with the tip of the pipette. Keep the glass slide at room temperature for 10 min. Pre-heat a hotplate to 70 C. Place the glass slide on the preheated hotplate to remove solvent and thermal cure the film at 70 C for 20 min. Drop cast films on glass slides at 210, 240, and 270 minutes provide clear films. Clear drop-cast films in 100-200 μm thickness range were confirmed at 60, 70 & 80 wt % loading by visual inspection. No yellowing and no crackling after solder reflow. No yellowing and no crackling after thermal aging tests.

Process for 80 Weight Percent OE-6636 Nanocomposite Thin Film for Ellipsometry

Figure 13:
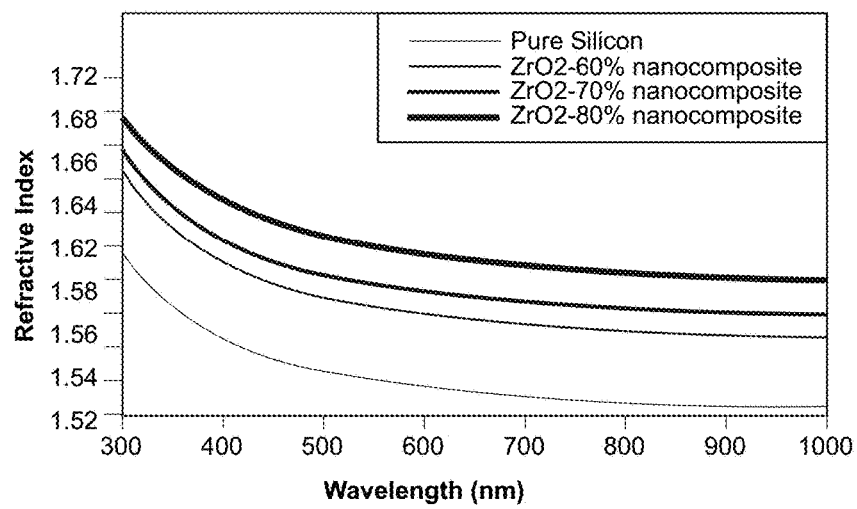
FIG. 13 shows refractive index versus wavelength for OE-6636 phenyl-methyl silicone at 60, 70 and 80 weight percent loading of zirconia nanocrystal.

A two-part, 80 weight percent nanocomposite formulation was prepared by the procedure described in example 5. After addition of OE-6636 part A when the viscosity of the mixture starts to increase, the OE-6636 nanocomposite solution was spin-applied on a glass substrate at 2000-3000 rpm spin speed as a single coat. The film was baked on a hot plate at 50 C for 30 minutes to flash-off the solvent and cure the silicone. No cracking was observed upon curing. Sample was measured in M-2000 over a wavelength range of 350 nm to 800 nm. The results are shown in Table 3 below and FIG. 13.

TABLE 3

Percent transmission values for OE-6636 silicone nanocomposite in example 6

| Sample | $ZrO_2$ Nanocrystal Part Number | Drop-cast Film Clarity | Measured RI 633 nm | 450 nm |
|---|---|---|---|---|
| OE6636 |  | Clear | 1.53 | 1.55 |
| OE6636 + 60 wt % $ZrO_2$ | NM17 | Clear/hazy | 1.58 | 1.60 |
| OE6636 + 70 wt % $ZrO_2$ | NM17 | Clear/hazy | 1.59 | 1.61 |
| OE6636 + 80 wt % ZrO2 | NM17 | Clear/hazy | 1.61 | 1.63 |

Example 7. Commercial Silicone KE-109E Nanocomposite with Dual Capped Nanocrystals and DMS-H25 at 80 Weight Percent Loading In a 40 ml vial, add the 4.80 g of dual capped nanocrystals (50 weight percent in xylene). Siloxane functional capping agent of the silicone capped nanocrystals is formed through the process described in example 1 from the reaction of vinyltrimethoxy silane and MCR-H11. The second capping agent of the nanocrystals is allyltrimethoxy silane. Then add and 0.60 g of a 50 weight percent solution of DMS-H25 in xylene. Using a magnetic stir bar, mix at room temperature for 2 min at 260 rpm. Mixture may appear hazy. Add 0.077 g of 350 ppm solution of platinum catalyst SIP6830.3 in xylene. Continue mixing at room temperature for 2 min at 260 rpm. Transfer the vial to a pre-heated oil bath to 90 C. Heat the mixture at 90 C in the oil bath for 30 min with stirring at 260 rpm. Cool down the mixture by letting it stand with no stirring at room temperature for 10 minutes. To the cooled mixture add 0.30 g of a 50 weight percent solution of KE-109E-Part B in xylene. Stir for 2 min at 260 rpm. Add silicone KE-109E-Part A solution to the mixture and stir for 2 min at 260 rpm. Pre-heat an oil bath to 70 C. Place the mixture in the 70 C oil bath and heat for 135±15 min. Ensure the liquid level of the mixture in the vial is completely submerged in the oil. Viscosity of mixture will increase over time. Using a pipette, drop cast the reacted mixture onto a glass slide. Break up any bubbles that form on the glass slide with the tip of the pipette. Keep the glass slide at room temperature for 10 min. Pre-heat a hotplate to 60 C. Place the glass slide on the preheated hotplate to remove solvent and thermal cure the film at 60 C for 20 min. Drop cast films on glass slides at 125, 135, and 145 minutes.

We claim:

1. A dispersion comprised of zirconia nanocrystals capped with a silicone capping agent in a solvent, wherein a 50 weight percent sample of the dispersion in the solvent in a 1 cm cuvette has a normal transmittance in the range of 5-99% as measured in a spectrophotometer at 350 nm.

2. The dispersion of claim 1 wherein said normal transmittance is in the range of 40-60%.

3. The dispersion of claim 1 wherein said normal transmittance is in the range of 5-10%.

4. The dispersion of claim 1 wherein said normal transmittance is in the range of 10-15%.

5. The dispersion of claim 1 wherein said normal transmittance is in the range of 15-20%.

6. The dispersion of claim 1 wherein said normal transmittance is in the range of 20-25%.

7. The dispersion of claim 1 wherein said normal transmittance is in the range of 25-30%.

8. The dispersion of claim 1 wherein said normal transmittance is in the range of 30-35%.

9. The dispersion of claim 1 wherein said normal transmittance is in the range of 35-40%.

10. The dispersion of claim 1 wherein said normal transmittance is in the range of 40-45%.

11. The dispersion of claim 1 wherein said normal transmittance is in the range of 45-50%.

12. The dispersion of claim 1 wherein said normal transmittance is in the range of 50-55%.

13. The dispersion of claim 1 wherein said normal transmittance is in the range of 55-60%.

14. The dispersion of claim 1 wherein said normal transmittance is in the range of 60-65%.

15. The dispersion of claim 1 wherein said normal transmittance is in the range of 65-70%.

16. The dispersion of claim 1 wherein said normal transmittance is in the range of 70-75%.

17. The dispersion of claim 1 wherein said normal transmittance is in the range of 75-80%.

18. The dispersion of claim 1 wherein said normal transmittance is in the range of 80-85%.

19. The dispersion of claim 1 wherein said normal transmittance is in the range of 85-90%.

20. The dispersion of claim 1 wherein said normal transmittance is in the range of 90-95%.

21. The dispersion of claim 1 wherein said normal transmittance is in the range of 95-99%.

* * * * *